US012525535B2

(12) United States Patent
Lee et al.

(10) Patent No.: US 12,525,535 B2
(45) Date of Patent: Jan. 13, 2026

(54) SEMICONDUCTOR DEVICE

(71) Applicant: Samsung Electronics Co., Ltd., Suwon-si (KR)

(72) Inventors: Doohyun Lee, Hwaseong-si (KR); Heonjong Shin, Yongin-si (KR); Minchan Gwak, Hwaseong-si (KR); Seonbae Kim, Hwaseong-si (KR); Jinyoung Park, Hwaseong-si (KR); Hyunho Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 617 days.

(21) Appl. No.: 17/734,473

(22) Filed: May 2, 2022

(65) Prior Publication Data

US 2023/0047343 A1 Feb. 16, 2023

(30) Foreign Application Priority Data

Aug. 10, 2021 (KR) .................. 10-2021-0105546

(51) Int. Cl.
*H01L 23/535* (2006.01)
*H01L 21/02* (2006.01)
(Continued)

(52) U.S. Cl.
CPC ........ *H01L 23/535* (2013.01); *H01L 21/0259* (2013.01); *H01L 21/32135* (2013.01);
(Continued)

(58) Field of Classification Search
CPC .............. H01L 23/535; H01L 21/0259; H01L 21/32135; H01L 21/32139;
(Continued)

(56) References Cited

U.S. PATENT DOCUMENTS 10,263,100 B1 4/2019 Bi et al.
10,304,833 B1 5/2019 Suvarna et al.
(Continued)

FOREIGN PATENT DOCUMENTS

CN 101933149 A 12/2010
CN 102034863 A 4/2011
(Continued)

OTHER PUBLICATIONS

Office Action dated Aug. 18, 2025 issued in corresponding Taiwanese Patent Application No. 11123888.
(Continued)

*Primary Examiner* — Cuong B Nguyen
(74) *Attorney, Agent, or Firm* — Harness, Dickey & Pierce, P.L.C.

(57) ABSTRACT

A semiconductor device includes active regions extending in a first direction on a substrate; a gate electrode intersecting the active regions on the substrate, extending in a second direction, and including a contact region protruding upwardly; and an interconnection line on the gate electrode and connected to the contact region, wherein the contact region includes a lower region having a first width in the second direction and an upper region located on the lower region and having a second width smaller than the first width in the second direction, and wherein at least one side surface of the contact region in the second direction has a point at which an inclination or a curvature is changed between the lower region and the upper region.

20 Claims, 30 Drawing Sheets

(51) Int. Cl.
  *H01L 21/3213* (2006.01)
  *H01L 21/768* (2006.01)
  *H01L 23/528* (2006.01)
  *H10D 30/01* (2025.01)
  *H10D 30/67* (2025.01)
  *H10D 62/10* (2025.01)
  *H10D 64/01* (2025.01)

(52) U.S. Cl.
  CPC .. *H01L 21/32139* (2013.01); *H01L 21/76895* (2013.01); *H01L 23/5283* (2013.01); *H10D 30/031* (2025.01); *H10D 30/6735* (2025.01); *H10D 30/6757* (2025.01); *H10D 62/118* (2025.01); *H10D 64/017* (2025.01); *H10D 64/018* (2025.01)

(58) Field of Classification Search
  CPC ........... H01L 21/76895; H01L 23/5283; H01L 21/76883; H01L 21/76897; H01L 23/5226; H01L 21/31144; H10D 30/031; H10D 30/6735; H10D 30/6757; H10D 62/118; H10D 64/017; H10D 64/018; H10D 64/252; H10D 84/0188; H10D 84/144; H10D 84/948; H10D 1/66; H10D 84/903; H10D 84/201; H10H 20/826; H10F 77/955
  See application file for complete search history.

(56) References Cited

U.S. PATENT DOCUMENTS

| | | |
|---|---|---|
| 10,381,490 B2 | 8/2019 | Kim et al. |
| 10,727,124 B2 | 7/2020 | Clevenger et al. |
| 10,916,544 B2 | 2/2021 | Xiao |
| 11,037,872 B2 | 6/2021 | Han et al. |
| 2008/0217790 A1 | 9/2008 | Hasunuma |
| 2011/0291190 A1 | 12/2011 | Xiao et al. |
| 2017/0222018 A1 | 8/2017 | Zhang |
| 2020/0043926 A1 | 2/2020 | Ohtou et al. |
| 2020/0091348 A1* | 3/2020 | Guha ............... H10D 84/83 |
| 2020/0135562 A1 | 4/2020 | Chen et al. |
| 2020/0411431 A1 | 12/2020 | Huang et al. |
| 2021/0111069 A1 | 4/2021 | Motoyama et al. |
| 2022/0384591 A1 | 12/2022 | Lee et al. |

FOREIGN PATENT DOCUMENTS

| | | |
|---|---|---|
| KR | 20200065617 A | 6/2020 |
| KR | 10-2022-0163538 A | 12/2022 |
| TW | 201703122 A | 1/2017 |
| TW | 201909283 A | 3/2019 |

OTHER PUBLICATIONS

Office Action for Korean Application No. 10-2021-0105546 dated Sep. 24, 2025.

* cited by examiner

SEMICONDUCTOR DEVICE

CROSS-REFERENCE TO RELATED APPLICATION(S)

This application claims the benefit under 35 USC 119(a) of Korean Patent Application No. 10-2021-0105546 filed on Aug. 10, 2021 in the Korean Intellectual Property Office, the entire disclosure of which is incorporated herein by reference for all purposes.

BACKGROUND

The present inventive concepts relate to semiconductor devices and/or manufacturing methods thereof As demand for high performance, high speed, and/or multifunctionality in semiconductor devices increases, the degree of integration of semiconductor devices is increasing. In manufacturing semiconductor devices having a fine pattern, in response to the trend for high integration of semiconductor devices, it is beneficial to implement patterns having a fine width or a fine separation distance. In addition, in order to overcome the limitation of operating characteristics due to the size reduction of planar metal oxide semiconductor FETs (MOSFETs), efforts are being made to develop semiconductor devices including FinFETs having a three-dimensional (3D) channel structure.

SUMMARY

Some example embodiments provide semiconductor devices having improved reliability and/or electrical characteristics. Some example embodiments provide manufacturing methods thereof.

According to example embodiments, a semiconductor device includes active regions extending in a first direction on a substrate; a gate electrode intersecting the active regions on the substrate and extending in a second direction; first and second channel structures spaced apart from each other in the second direction on the active regions, each of the first and second channel structures including a plurality of channel layers spaced apart from each other in a third direction perpendicular to an upper surface of the substrate and surrounded by the gate electrode; an interconnection line on the gate electrode and connected to the gate electrode; and source/drain regions in regions in which the active regions are recessed on both sides of the gate electrode and in contact with the plurality of channel layers, the gate electrode including a contact region located on at least a portion of a first uppermost channel layer that is an uppermost channel layer among the plurality of channel layers of the first channel structure and connected to the interconnection line, and the gate electrode exposing at least a portion of a second uppermost channel layer that is an uppermost channel layer among the plurality of channel layers of the second channel structure.

According to example embodiments, a semiconductor device includes active regions extending in a first direction on a substrate; a gate electrode intersecting the active regions on the substrate, extending in a second direction, and including a contact region protruding upwardly; and an interconnection line on the gate electrode and connected to the contact region, the contact region including a lower region having a first width in the second direction and an upper region located on the lower region and having a second width smaller than the first width in the second direction, and at least one side surface of the contact region in the second direction having a point at which an inclination or a curvature is changed between the lower region and the upper region.

According to example embodiments, a semiconductor device includes active regions extending in a first direction on a substrate; a gate electrode intersecting the active regions on the substrate and extending in a second direction; first and second channel structures spaced apart from each other in the second direction on the active regions, each of the first and second channel structures including a plurality of channel layers spaced apart from each other in a third direction perpendicular to an upper surface of the substrate and surrounded by the gate electrode; and an interconnection line on the gate electrode and connected to the gate electrode, an upper surface of the gate electrode being located at a first level to be connected to the interconnection line on at least a portion of the first channel structure, and being located at a second level adjacent to an uppermost channel layer among the plurality of channel layers of the second channel structure on at least a portion of the second channel structure and lower than the first level.

According to example embodiments, a semiconductor device includes active regions extending in a first direction on a substrate; a gate electrode intersecting the active regions on the substrate and extending in a second direction; an interlayer insulating layer on the gate electrode; a contact region passing through the interlayer insulating layer and connected to the gate electrode; and an interconnection line on the contact region, connected to the contact region, and extending in the first direction, and the contact region including recess regions extending from side surfaces of the interconnection line in the second direction.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
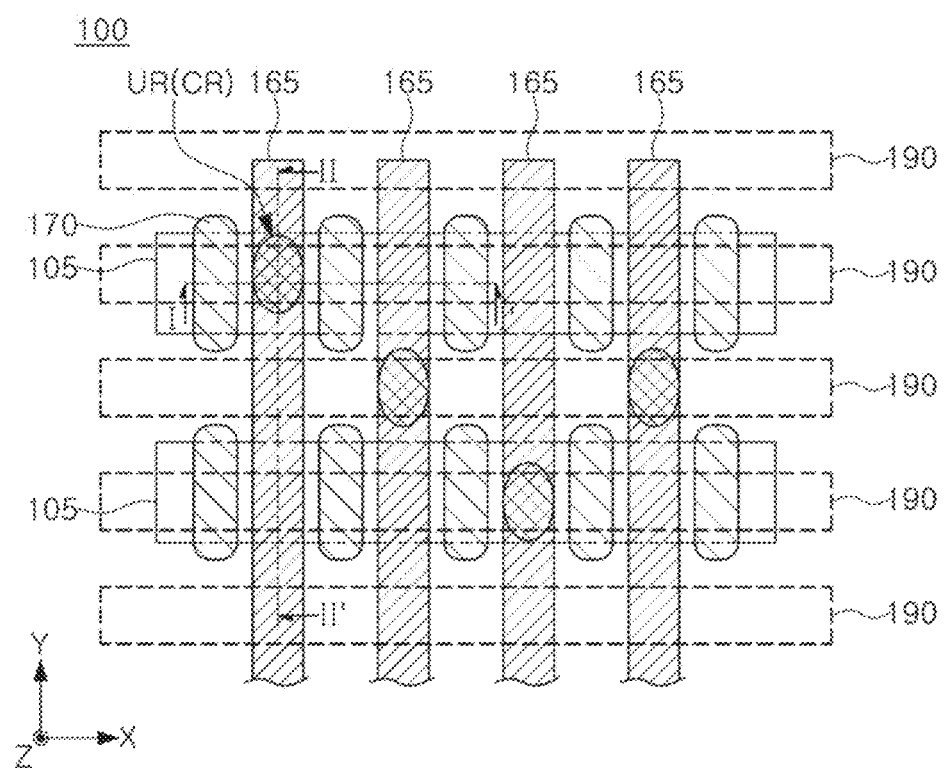
FIG. 1 is a layout diagram illustrating a semiconductor device according to some example embodiments.

FIG. 1 is a layout diagram illustrating a semiconductor device according to some example embodiments.

Figure 2A:
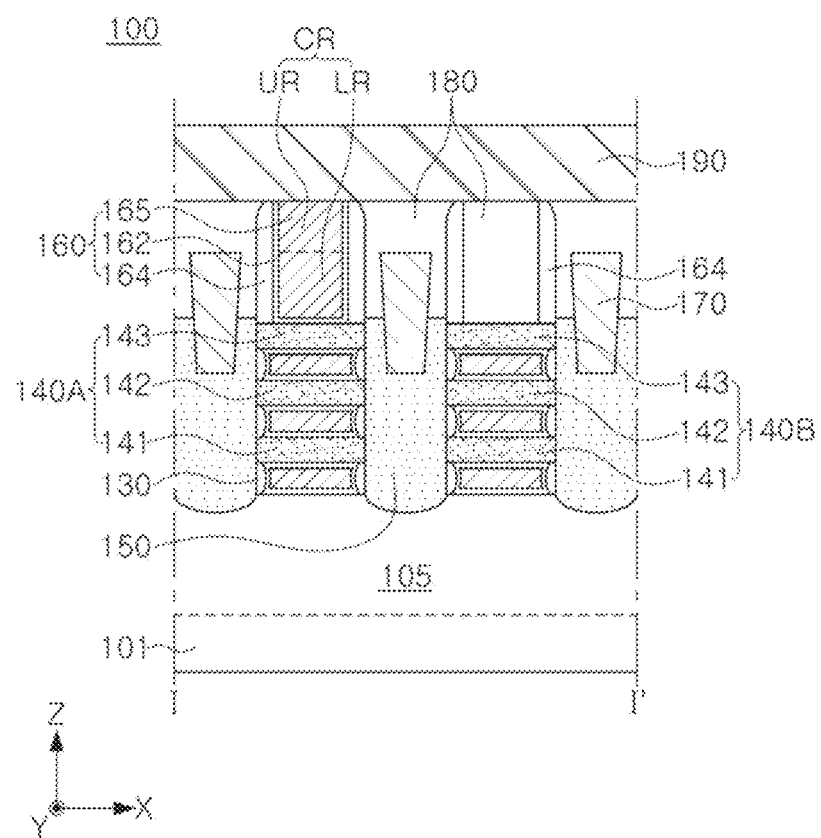
FIGS. 2A and 2B are schematic cross-sectional views illustrating a semiconductor device according to some example embodiments.
Figure 2B:
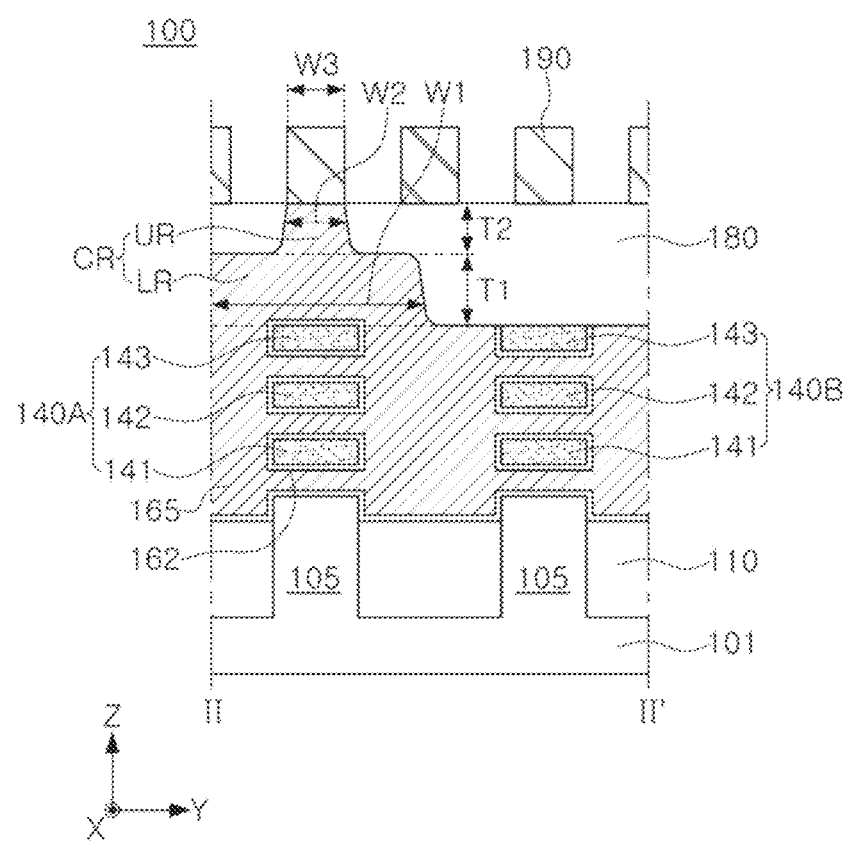

FIGS. 2A and 2B are schematic cross-sectional views illustrating a semiconductor device according to some example embodiments. FIGS. 2A and 2B illustrate cross-sections of the semiconductor device of FIG. 1 taken along cutting lines I-I' and II-II'.

Figure 3:
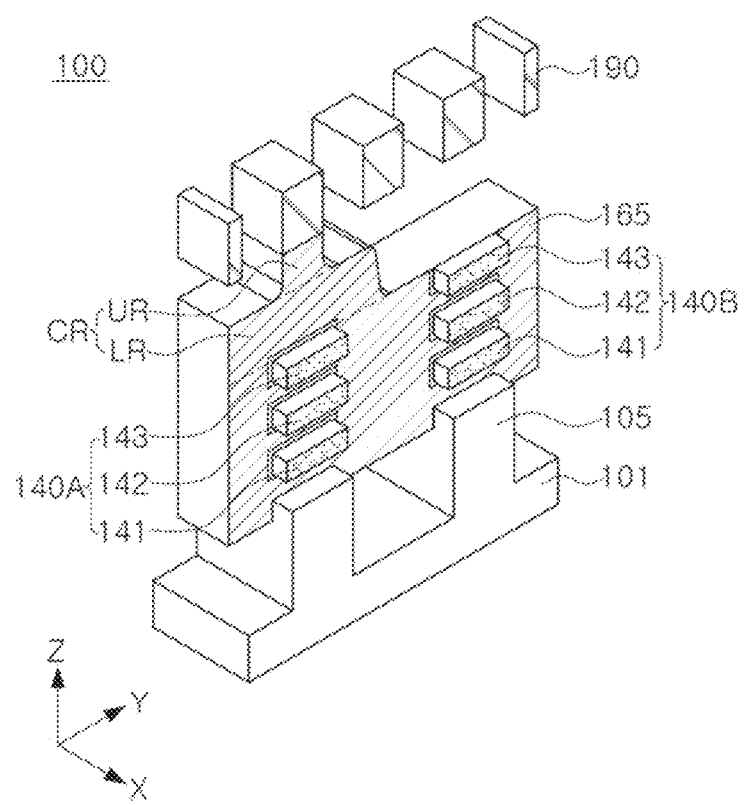
FIG. 3 is a schematic perspective view illustrating a semiconductor device according to some example embodiments.

FIG. 3 is a schematic perspective view illustrating a semiconductor device according to some example embodiments. For convenience of description, only some components of the semiconductor device are illustrated in FIGS. 1 and 3.

Referring to FIGS. 1 to 3, a semiconductor device 100 may include a substrate 101, active regions 105 on the substrate 101, first and second channel structures 140A and 140B disposed on the active regions 105 and including a plurality of channel layers 141, 142, and 143 spaced apart from each other in a direction, gate electrodes 165 extending to intersect the active regions 105, source/drain regions 150 in contact with the plurality of channel layers 141, 142, and 143, and contact plugs 170 connected to the source/drain regions 150. The semiconductor device 100 may further include a gate dielectric layer 162 and gate spacer layers 164 constituting a gate structure 160, a device isolation layer 110, internal spacer layers 130, an interlayer insulating layer 180, and interconnection lines 190.

In the semiconductor device 100, the active region 105 may have a fin structure, and the gate electrode 165 may be disposed between the active region 105 and first and second channel structures 140A and 140B, between the plurality of channel layers 141, 142, and 143 of the first and second channel structures 140A and 140B, and on the first channel structure 140A. Accordingly, the semiconductor device 100 may include a transistor having a multi-bridge channel field effect transistor (MBCFET™) structure, which is a gate-all-around type FET.

The substrate 101 may have an upper surface extending in an X-direction and a Y-direction. The substrate 101 may include a semiconductor material, for example, a group IV semiconductor, a group III-V compound semiconductor, or a group II-VI compound semiconductor. For example, the group IV semiconductor may include silicon, germanium, and/or silicon-germanium. The substrate 101 may be provided as a bulk wafer, an epitaxial layer, a silicon-on-insulator (SOI) layer, a semiconductor on insulator (SeOI) layer, etc.

The device isolation layer 110 may define the active regions 105 in the substrate 101. The device isolation layer 110 may be formed by, for example, a shallow trench isolation (STI) process. According to some example embodiments, the device isolation layer 110 may further include a region having a step to a lower portion of the substrate 101 and extending more deeply. The device isolation layer 110 may expose an upper surface of the active region 105, and, according to some example embodiments, may partially expose an upper portion of the active region 105. In example embodiments, the device isolation layer 110 may have a curved upper surface to have a higher level as the device isolation layer 110 is more adjacent to the active region 105. The device isolation layer 110 may be formed of an insulating material. The device isolation layer 110 may include, for example, oxide, nitride, or a combination thereof.

The active regions 105 may be defined by the device isolation layer 110 in the substrate 101 and each may be disposed to extend in a first direction, for example, the X-direction. The active regions 105 may have a structure protruding from the substrate 101. According to some example embodiments, upper ends of the active regions 105 may be disposed to protrude from an upper surface of the device isolation layer 110 at a certain height. The active regions 105 may be formed as a part of the substrate 101, or may include an epitaxial layer grown from the substrate 101. The active regions 105 may be partially recessed in both sides of the gate structures 160 so that recessed regions are formed, and the source/drain regions 150 may be respectively disposed in the recessed regions.

In example embodiments, the active regions 105 may include an impurity region. The impurity region may correspond to a well region of a transistor. Accordingly, in the case of a p-type transistor (pFET), the impurity region may include n-type impurities such as phosphorus (P), arsenic (As), or antimony (Sb), and in the case of an n-type transistor (nFET), the impurity region may include p-type impurities such as boron (B), gallium (Ga), or aluminum (Al). The impurity region may be located in the active regions 105 and the upper surface of the substrate 101 at a certain depth.

Each of the first and second channel structures 140A and 140B may include the first to third channel layers 141, 142, and 143 that are two or more channel layers disposed on the active regions 105 and spaced apart from each other in a direction, for example, a Z-direction, perpendicular to the upper surfaces of the active regions 105. Hereinafter, for convenience of description, a channel structure overlapping a contact region CR of the gate electrode 165 is referred to as the first channel structure 140A, and a channel structure not overlapping the contact region CR is referred to as the second channel structure 140B. The first to third channel layers 141, 142, and 143 may be spaced apart from the upper surface of the active region 105 while being connected to the source/drain regions 150. The first to third channel layers 141, 142, and 143 may have the same or similar width as that of the active region 105 in the Y-direction, and may have the same or similar width as that of the gate structure 160 in the X-direction. For example, in some example embodiments, each of the first to third channel layers 141, 142, and 143 may have a smaller width than that of the gate structure 160 so that side surfaces of the first to third channel layers 141, 142, and 143 are located below the gate structure 160 in the X-direction.

The first to third channel layers 141, 142, and 143 may be formed of a semiconductor material, and may include, for example, at least one of silicon (Si), silicon germanium (SiGe), and germanium (Ge). The first to third channel layers 141, 142, and 143 may be formed of, for example, the same material as that of the substrate 101. According to some example embodiments, the first to third channel layers 141, 142, and 143 may include an impurity region located in a region adjacent to the source/drain regions 150. The number and shape of the channel layers 141, 142, and 143 of each of the first and second channel structures 140A and 140B may be changed in various ways in some example embodiments. For example, in some example embodiments, the first and second channel structures 140A and 140B may further include a channel layer disposed on the upper surface of the active region 105.

The source/drain regions 150 may be respectively disposed on the active regions 105 on both sides of the gate structures 160 and the first and second channel structures 140A and 140B. The source/drain regions 150 may be disposed in recess regions in which the upper portions of the active regions 105 are partially recessed. The source/drain regions 150 may be in contact with the plurality of channel layers 141, 142, and 143 of the first and second channel structures 140A and 140B, and may be disposed to cover side surfaces of each of the plurality of channel layers 141, 142, and 143. The upper surfaces of the source/drain regions 150 may be located at the same or similar height as that of lower surfaces of the gate structures 160, and the height may be changed in various ways in some example embodiments. According to some example embodiments, the source/drain regions 150 may be connected to or merged with each other on two or more active regions 105 adjacent in the Y-direction to constitute one source/drain region 150.

The gate structures 160 may be disposed on the active regions 105 and the first and second channel structures 140A and 140B to intersect the active regions 105 and the first and second channel structures 140A and 140B and extend in a second direction, for example, the Y-direction. Channel regions of transistors may be formed in the active regions 105 and/or the first and second channel structures 140A and 140B intersecting the gate electrode 165 of the gate structure 160.

The gate structure 160 may include a gate electrode 165, a gate dielectric layer 162 between the gate electrode 165 and the plurality of channel layers 141, 142, 143, and gate spacer layers 164 on side surfaces of the gate electrode 165 on the first channel structure 140A. In example embodiments, the gate structure 160 may further include a capping layer on an upper surface of the gate electrode 165. Alternatively, a part of the interlayer insulating layer 180 on the gate structure 160 may be referred to as a gate capping layer.

The gate dielectric layer 162 may be disposed between the active region 105 and the gate electrode 165 and between the first and second channel structures 140A and 140B and the gate electrode 165, and may be disposed to cover at least a portion of surfaces of the gate electrode 165. For example, the gate dielectric layer 162 may be disposed to surround all surfaces of the gate electrode 165 except the uppermost surface. The gate dielectric layer 162 may extend between the gate electrode 165 and the gate spacer layers 164, but is not limited thereto.

The gate dielectric layer 162 may include an oxide, nitride, or high-k material. The high-k material may mean a dielectric material having a higher dielectric constant than that of a silicon oxide layer ($SiO_2$). The high-k material may be any one of, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). According to some example embodiments, the gate dielectric layer 162 may be formed as a multilayer film.

The gate electrode 165 may be disposed in the upper portion of the active region 105 to fill between the plurality of channel layers 141, 142, and 143, and extend onto a part of the first and second channel structures 140A and 140B. The gate electrode 165 may be spaced apart from the plurality of channel layers 141, 142, and 143 and the active regions 105 by the gate dielectric layer 162.

The gate electrode 165 may include the contact region CR that protrudes upward and is connected to the interconnection line 190. The contact region CR may constitute a part of the gate electrode 165 and may function as a contact layer with the interconnection line 190. The contact region CR may be a region remaining after partially removing the upper portion of the gate electrode 165. As illustrated in FIG. 1, the contact region CR may be located in at least one region of the gate electrode 165 extending in the Y-direction. The contact region CR may be located to vertically overlap the at least one interconnection line 190. As illustrated in FIGS. 2A and 2B, the contact region CR may be located on the first channel structure 140A and may be disposed to fill between a pair of gate spacer layers 164. Since the contact region CR needs to be connected to a region of the gate electrode 165 therebelow, at least one of both side surfaces in the Y-direction may be located outside the first channel structure 140A so as not to overlap the first channel structure 140A in the Z-direction.

The contact region CR may include a lower region LR and an upper region UR in the Z-direction. The lower region LR may be located on the first channel structure 140A, and the upper region UR may be located on the lower region LR. In FIG. 2B, the contact region CR may be located adjacent to an end portion of the gate electrode 165 in the Y-direction, so that the contact region CR, particularly the lower region LR, may have an asymmetric shape with respect to a central axis on a cross-sectional view in the Y-direction. However, such a shape of the contact region CR may be changed according to an arrangement location, as will be described with reference to FIG. 4C below.

The upper region UR may have a second width W2 smaller than a first width W1 of the lower region LR in the Y-direction. The first width W1 may be greater than a third width W3 of the interconnection line 190, and the second width W2 may be equal to or greater than the third width W3. There may be a step between the lower region LR and the upper region UR. The upper region UR may have vertical, inclined, or curved side surfaces while extending downward from both side surfaces of the interconnection line 190 in the Y direction. A width of the upper surface of the upper region UR may be smaller than that of the lower surface thereof. According to a manufacturing process of the semiconductor device 100, side surfaces of the upper region UR may have a curve of a concave shape (e.g., rounded/curved inwardly or hollowed out), but the shape of the side surfaces is not limited thereto. The lower region LR may have an upper surface extending horizontally from lower ends of the side surfaces of the upper region UR and side surfaces extending obliquely from an end of the upper surface. Alternatively, the lower region LR may have side surfaces extending obliquely from the side surfaces of the upper region UR without a horizontally extending region. The lower region LR may have a width on its upper surface smaller than a width on its lower surface, but is not limited thereto.

At least one side surface of the contact region CR in the Y-direction may have a point between the lower region LR and the upper region UR at which at least one of inclination, curvature, and width is changed or discontinuously and rapidly changed. Accordingly, in the contact region CR, the lower region LR and the upper region UR may be distinguished by a shape. For example, a location of a lower end of at least one side surface of the upper region UR and a location of a lower end of at least one side surface of the lower region LR may be shifted from each other in the Y-direction by a length greater than a difference according to the range of inclination. At least one side surface of the upper region UR and at least one side surface of the lower region LR may not be coplanar with each other.

The total height or thickness T1+T2 of the contact region CR may be, for example, in the range of about or exactly 10 nm to about or exactly 30 nm. The thickness T1 of the lower region LR may be the same as or different from the thickness T2 of the upper region UR, and the relative thicknesses of the lower region LR and the upper region UR may be changed in various ways in some example embodiments.

The upper surface of the gate electrode 165 may have a lower level on the second channel structure 140B than a level on the first channel structure 140A. The upper surface of the gate electrode 165 may be located adjacent to the uppermost third channel layer 143 in a region where the contact region CR is not located, and the gate electrode 165 may expose the third channel layer 143. The upper surface of the gate electrode 165 on the second channel structure 140B may be located at the same or lower level as that of the upper surface of the third channel layer 143, and may be located at the same or higher level as that of the lower surface of the third channel layer 143. That is the upper surface of the gate electrode 165 may be different between the first and second channel structures 140A and 140B.

As illustrated in FIG. 2B, the upper surface of the third channel layer 143 of the second channel structure 140B may be exposed by the gate electrode 165 and covered with the interlayer insulating layer 180. However, according to some example embodiments, the gate dielectric layer 162 may remain on the third channel layer 143.

The gate electrode 165 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. According to some example embodiments, the gate electrode 165 may be formed as two or more multilayers.

As described above, in the semiconductor device 100, the gate electrode 165 may include the contact region CR integrally formed with the gate electrode 165 in a partial region, and may expose the second channel structure 140B in a region where the contact region CR is not disposed. Outside the contact region CR, the gate electrode 165 may not be disposed on the second channel structure 140B, and thus, the parasitic capacitance may be reduced. Also, compared to the case where the gate electrode 165 does not include the contact region CR and a separate gate contact is disposed between the gate electrode 165 and the interconnection line 190, the semiconductor device 100 may prevent or reduce the likelihood of an electrical short that may occur depending on a depth of the gate contact, and may also prevent or reduce the likelihood of an electrical short between the separate gate contact and the contact plug 170 adjacent in the x direction and/or between the separate gate contact and a via disposed to connect the contact plug 170 and the interconnection line 190 adjacent in the x direction. In particular, since the contact region CR has a concave shape (e.g., rounded/curved inwardly or hollowed out), an electrical short between the interconnection lines 190 adjacent in the Y-direction may be prevented or have a likelihood of reduced thereof.

The gate spacer layers 164 may be disposed on both side surfaces of the contact region CR of the gate electrode 165. As shown in FIG. 2A, the gate spacer layers 164 may be disposed on both side surfaces of the contact region CR. The gate spacer layers 164 may be disposed in the interlayer insulating layer 180 in a region where the gate electrode 165 is partially removed. The gate spacer layers 164 may insulate the source/drain regions 150 from the gate electrodes 165. According to some example embodiments, the gate spacer layers 164 may be formed as a multilayer structure. The gate spacer layers 164 may be formed of oxide, nitride, or oxynitride, and in particular, a low-k film.

The internal spacer layers 130 may be disposed with the gate electrode 165 between the plurality of channel layers 141, 142, and 143. The gate electrode 165 may be stably spaced apart from the source/drain regions 150 by the internal spacer layers 130 and electrically isolated from each other. The internal spacer layers 130 may have a shape in which a side surface facing the gate electrode 165 is convexly rounded inwardly toward the gate electrode 165, but are not limited thereto. The internal spacer layers 130 may be formed of oxide, nitride, and/or oxynitride, and in particular, a low-k film. However, according to some example embodiments, the internal spacer layers 130 may be omitted.

The contact plugs 170 may pass through at least a portion of the interlayer insulating layer 180 and be connected to the source/drain regions 150, and may apply an electrical signal to the source/drain regions 150. The contact plugs 170 may have inclined side surfaces in which a width of a lower portion is narrower than a width of an upper portion according to an aspect ratio, but are not limited thereto. The contact plugs 170 may extend from the upper portion, for example, to down a lower surface of the third channel layer 143, but are not limited thereto. In example embodiments, the contact plugs 170 may be disposed to contact along the upper surfaces of the source/drain regions 150 without recessing the source/drain regions 150. A separate via may be further disposed on a part of the contact plug 170, and the contact plug 170 may be connected to the interconnection line 190 through the via. However, according to some example embodiments, the contact plug 170 may be directly connected to the interconnection line 190 through a region protruding upwardly instead of the via.

The contact plugs 170 may include a metal silicide layer disposed at a lower end including the lower surface, and may further include a barrier layer disposed on an upper surface of the metal silicide layer and sidewalls of the contact plugs 170. The barrier layer may include, for example, a metal nitride such as a titanium nitride layer (TiN), a tantalum nitride layer (TaN), and/or a tungsten nitride layer (WN). The contact plugs 170 may include, for example, a metal material such as aluminum (Al), tungsten (W), or molybdenum (Mo). In example embodiments, the number and arrangement of conductive layers constituting the contact plugs 170 may be changed in various ways.

The interlayer insulating layer 180 may be disposed to cover the source/drain regions 150 and the gate structures 160, and cover the device isolation layer 110. The interlayer insulating layer 180 may include at least one of oxide, nitride, and oxynitride, and may include, for example, a low-k material. According to some example embodiments, the interlayer insulating layer 180 may include a plurality of insulating layers.

FIGS. 4A through 4D are schematic cross-sectional views illustrating semiconductor devices according to some example embodiments. FIGS. 4A to 4D each illustrate a region corresponding to FIG. 2B. Hereinafter, redundant descriptions with those described above with reference to FIGS. 1 to 3 are omitted.

Figure 4A:
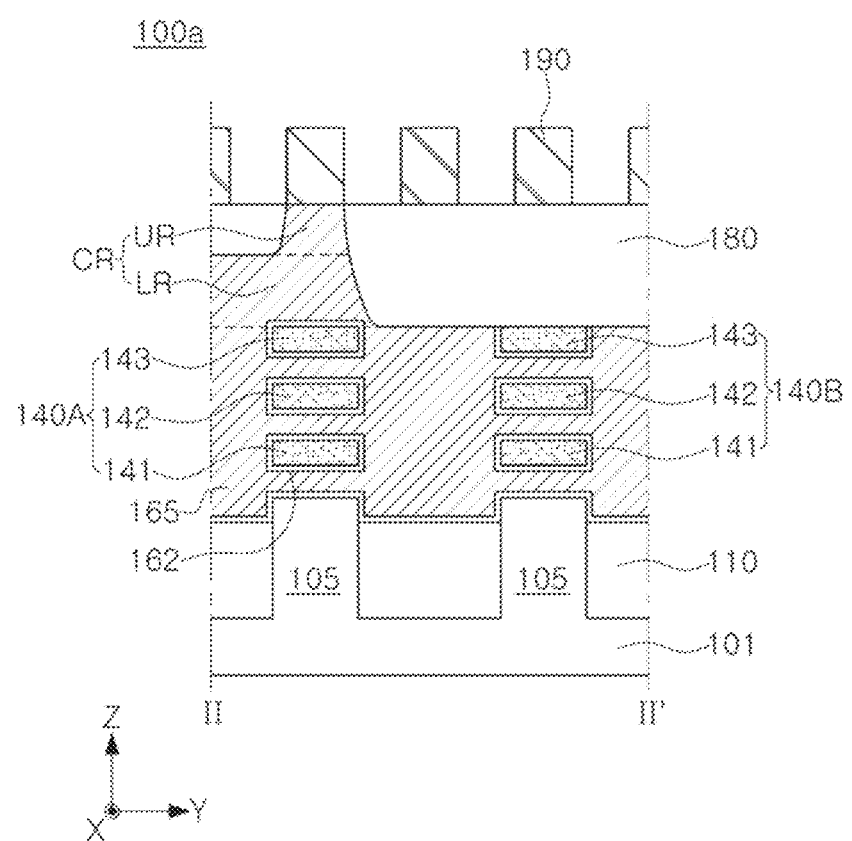
FIGS. 4A through 4D are schematic cross-sectional views illustrating semiconductor devices according to some example embodiments.

Referring to FIG. 4A, in a semiconductor device 100*a*, the shape of the contact region CR may be different from that of the example embodiments of FIG. 2B. Specifically, a right side surface of the contact region CR may extend with the same or continuously changed inclination in the upper region UR and the lower region LR. The right side surface may have a continuously extending shape without having a region in which a curvature is discontinuously changed or a horizontal region between the upper region UR and the lower region LR. In some example embodiments, the right side surface may have a vertical shape.

Figure 4B:
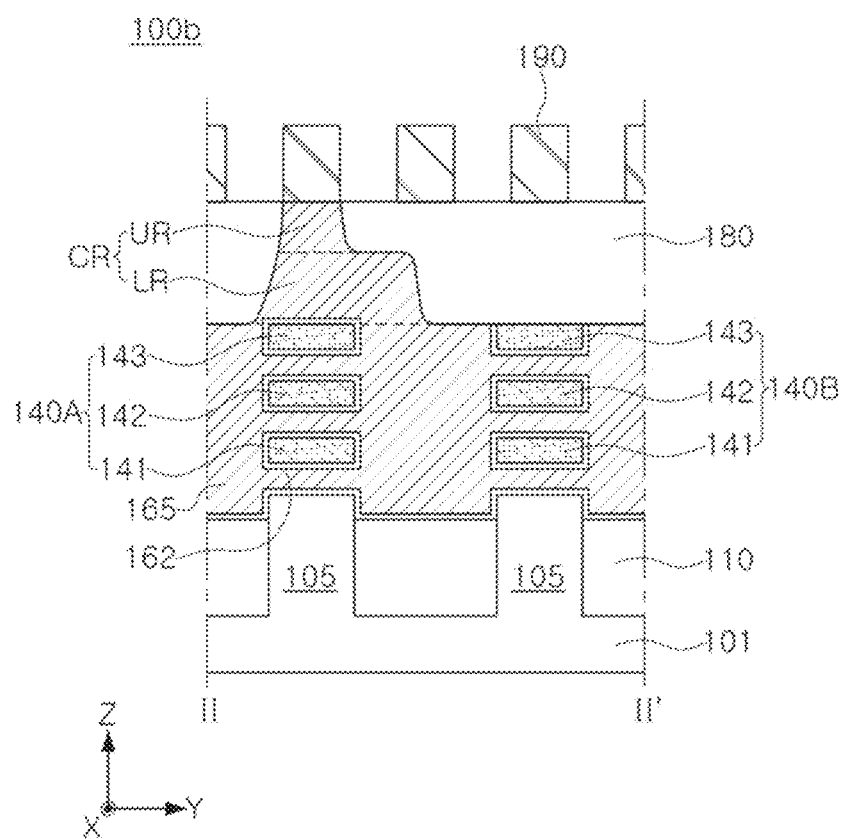

Referring to FIG. 4B, in a semiconductor device 100*b*, the shape of the contact region CR may be different from that of the example embodiments of FIG. 2B. Specifically, a left side surface of the of the contact region CR may extend with the same or continuously changed inclination in the upper region UR and the lower region LR. The left side surface may have a continuously extending shape without having a region in which a curvature is discontinuously changed or a horizontal region between the upper region UR and the lower region LR. In some example embodiments, the left side surface may have a vertical shape.

Figure 4C:
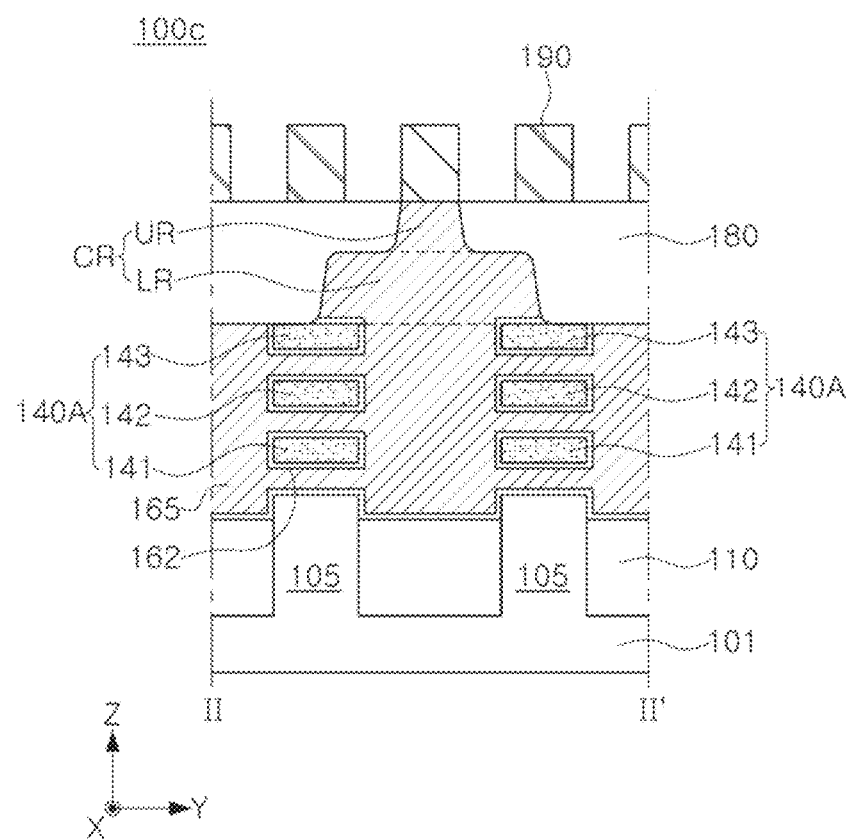

Referring to FIG. 4C, in a semiconductor device 100*c*, a location of the interconnection line 190 connected to the contact region CR and a shape of the contact region CR may be different from those of the example embodiments of FIG. 2B. Specifically, the contact region CR may be located to be spaced apart from an end portion of the gate electrode 165. Accordingly, the contact region CR may have a shape in which left and right are symmetrical in the Y-direction and may vertically overlap parts of the plurality of first channel structures 140A. In FIG. 4C, a width of the lower region LR may be changed in various ways in a greater range than that of the upper region UR.

Figure 4D:
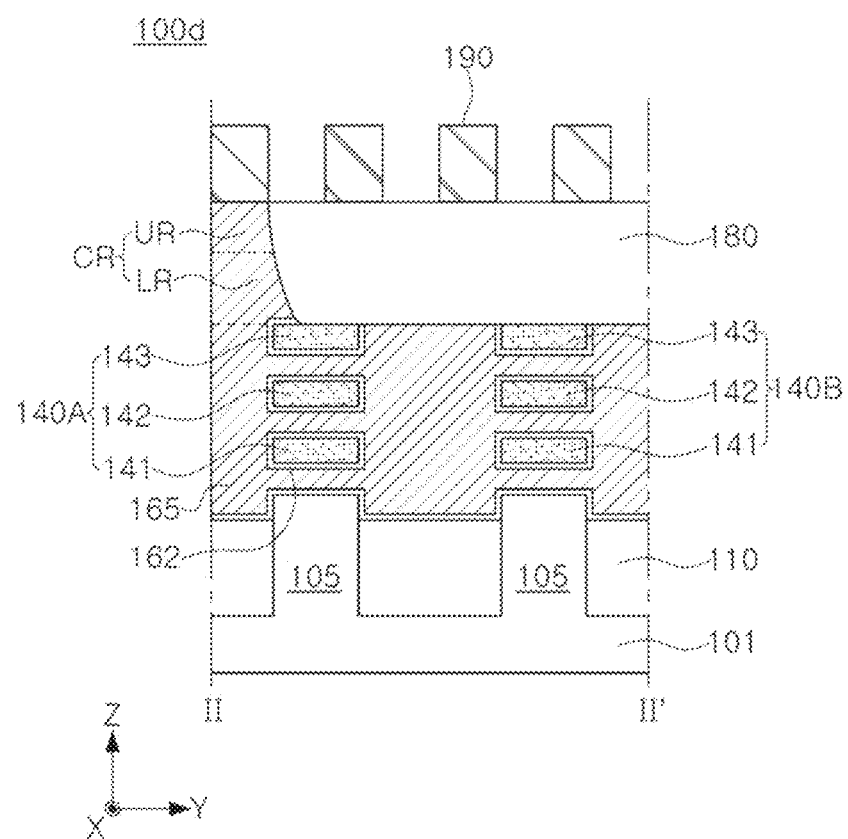

Referring to FIG. 4D, in a semiconductor device 100*d*, a location of the interconnection line 190 connected to the contact region CR and a shape of the contact region CR may be different from those of the example embodiments of FIG. 2B. Also, FIG. 4D illustrates some example embodiments in a region including a left end portion of the gate electrode 165.

A left side surface of the contact area CR may extend vertically or have a certain inclination in the upper region UR and the lower region LR. The left side surface may extend to be coplanar with the entire left side surface of the gate electrode 165. A right side surface of the contact region CR may extend with the same or continuously changed inclination in the upper region UR and the lower region LR. The right side surface may have a continuously extending shape without having a region in which a curvature is discontinuously changed or a horizontal region between the upper region UR and the lower region LR. Accordingly, there may be no step region between the upper region UR and the lower region LR in the contact region CR.

As described above, in some example embodiments, the contact region CR may have various shapes according to a location and a manufacturing process.

Figure 5:
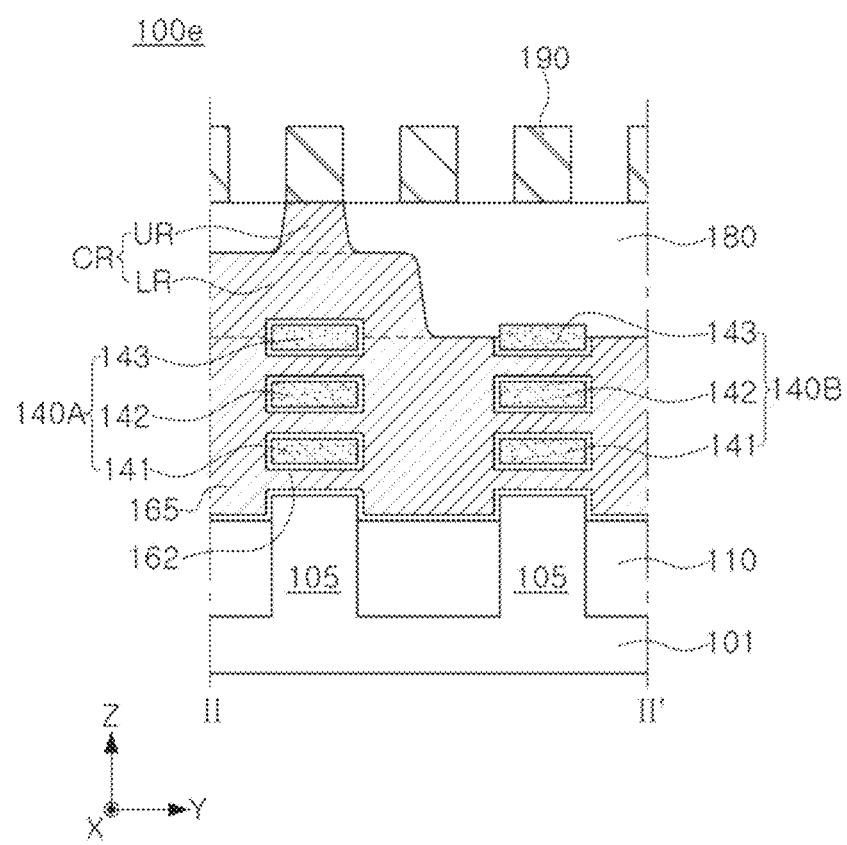
FIG. 5 is a schematic cross-sectional view illustrating a semiconductor device according to some example embodiments.

FIG. 5 is a schematic cross-sectional view illustrating a semiconductor device according to some example embodiments. FIG. 5 illustrates a region corresponding to FIG. 2B.

Referring to FIG. 5, in a semiconductor device 100*e*, an upper surface of the gate electrode 165 may be located at a level lower than that of an upper surface of the third channel layer 143 outside the contact region CR. Specifically, on the second channel structure 140B, the upper surface of the gate electrode 165 may be located at a level lower than that of the upper surface of the third channel layer 143, and may be located at a level equal to or higher than that of a lower surface of the third channel layer 143. In some example embodiments, the level of the upper surface of the gate electrode 165 outside the contact region CR may be changed in various ways within the above range. The third channel layer 143 of the second channel structure 140B may function as a channel region of a transistor by the gate electrode 165 on the lower surface and side surfaces thereof. The gate dielectric layer 162 may not extend above upper surface of the gate electrode 165 adjacent gate dielectric layer 162.

Figure 6:
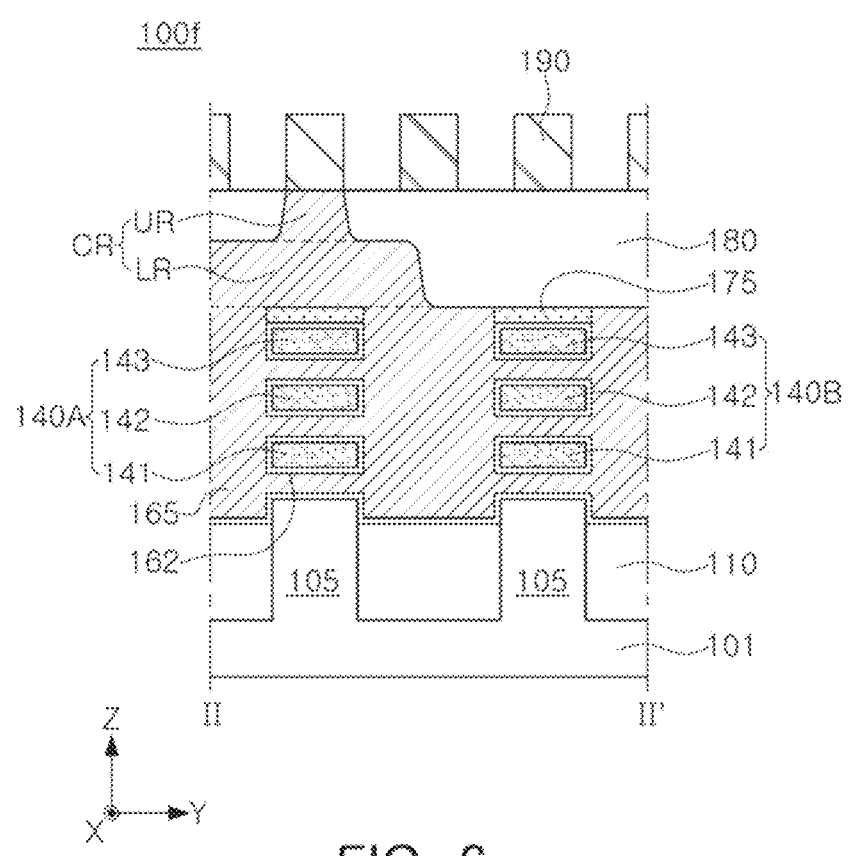
FIG. 6 is a schematic cross-sectional view illustrating a semiconductor device according to some example embodiments.

FIG. 6 is a schematic cross-sectional view illustrating a semiconductor device according to some example embodiments. FIG. 6 illustrates a region corresponding to FIG. 2B.

Referring to FIG. 6, a semiconductor device 100*f* may further include etch stop layers 175 disposed on the third channel layers 143 of the first and second channel structures 140A and 140B. The gate electrode 165 may cover the etch stop layer 175 on the first channel structure 140A and expose the etch stop layer 175 on the second channel structure 140B. The gate electrode 165 may not be disposed on the second channel structure 140B. An upper surface of the third channel layer 143 of the second channel structure 140B may be covered with the gate dielectric layer 162 and the etch stop layer 175. The gate dielectric layer 162 may separate the third channel layers 143 and the etch stop layer 175.

The etch stop layers 175 may function as etch stop layers in a process of forming the contact region CR. Accordingly, the etch stop layers 175 may include a material different from that of the gate electrode 165, for example, an insulating material. The etch stop layers 175 may include, for example, at least one of silicon oxide, silicon nitride, and silicon oxynitride, but are not limited thereto.

Figure 7:
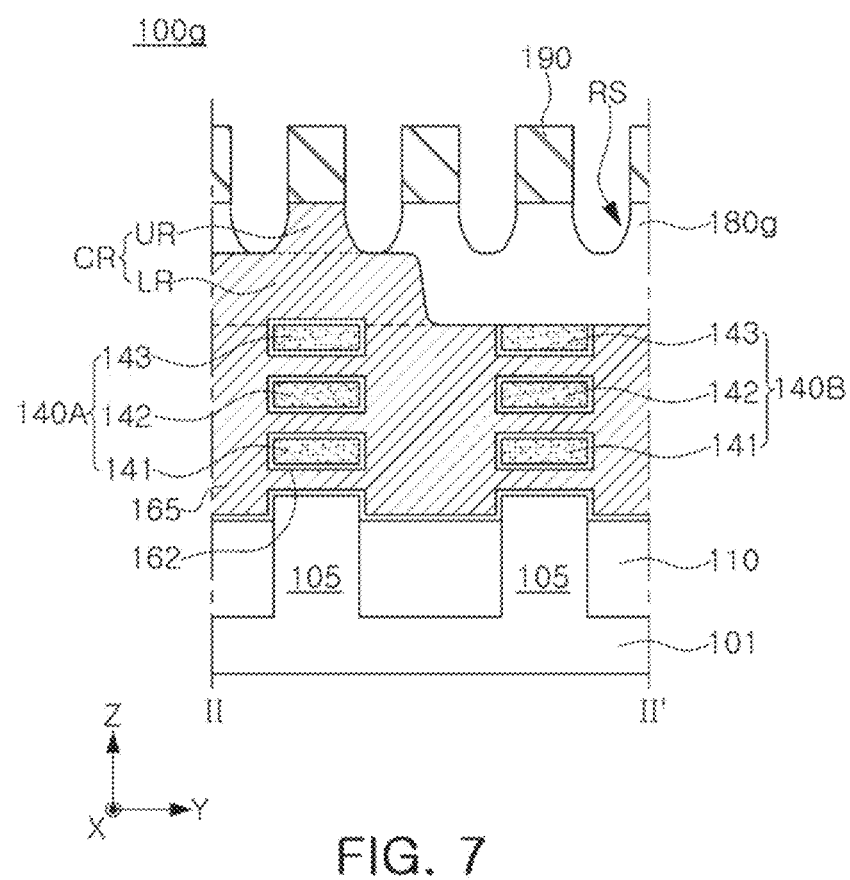
FIG. 7 is a schematic cross-sectional view illustrating a semiconductor device according to some example embodiments.

FIG. 7 is a schematic cross-sectional view illustrating a semiconductor device according to some example embodiments. FIG. 7 illustrates a region corresponding to FIG. 2B.

Referring to FIG. 7, in a semiconductor device 100*g*, an interlayer insulating layer 180*g* may have removed regions RS recessed downwardly between the interconnection lines 190. The removed regions RS may have a shape concavely recessed from upper surfaces between end portions of the interconnection lines 190 adjacent in the y direction and may extend in the x direction. Accordingly, an upper surface of the interlayer insulating layer 180*g* may have curves in a concave shape (e.g., rounded/curved inwardly or hollowed out). However, according to some example embodiments, the removed regions RS may include regions having an upward convex shape. An insulating layer may be further disposed on the interlayer insulating layer 180*g* to fill between the removed regions RS and between the interconnection lines 190.

Some of the removed region RS may be in contact with a part of the contact region CR, and may be defined by side surfaces of the upper region UR of the contact region CR. The contact region CR may be formed by further removing a part of the contact region CR by a process of forming the removed regions RS during a manufacturing process of the semiconductor device 100*g*. According to some example embodiments, widths of the removed regions RS in the Y-direction may be changed in various ways, and accordingly, a width of the upper region UR of the contact region CR and shape of the side surfaces thereof may also be changed in various ways. In some example embodiments, since the contact region CR is additionally removed and formed, an electrical short with the interconnection lines 190 adjacent in the Y-direction may be further prevented or the likelihood thereof reduced.

Figure 8:
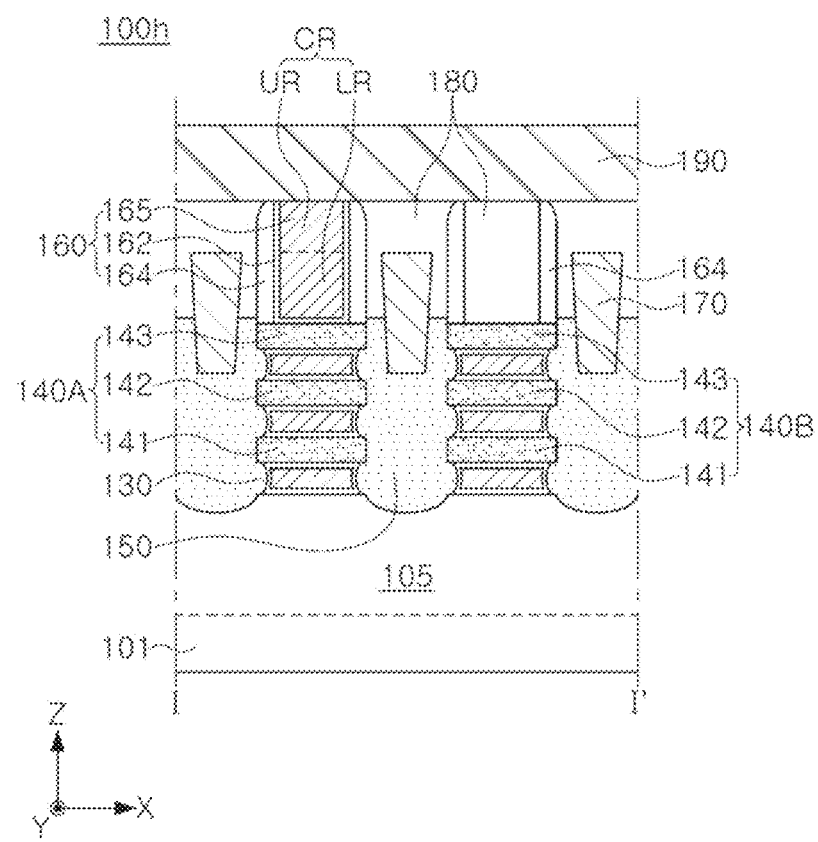
FIG. 8 is a schematic cross-sectional view illustrating a semiconductor device according to some example embodiments.

FIG. 8 is a schematic cross-sectional view illustrating a semiconductor device according to some example embodiments. FIG. 8 illustrates a region corresponding to FIG. 2A.

Referring to FIG. 8, a semiconductor device 100h may not include the internal spacer layer 130, unlike the example embodiments of FIG. 2A. In this case, the source/drain regions 150 may be disposed to expand to between the plurality of channel layers 141, 142, and 143 and below the first channel layer 141. Alternatively, in some example embodiments, the gate electrodes 165 located between the plurality of channel layers 141, 142, and 143 and below the first channel layer 141 may be disposed to expand in the X-direction. The gate electrodes 165 may be spaced apart from the source/drain regions 150 by the gate dielectric layers 162.

According to the above structure, the internal spacer layer 130 is omitted, so that the source/drain regions 150 may have improved crystallinity when the source/drain regions 150 are grown. According to some example embodiments, the internal spacer layer 130 may be omitted only in some elements of the semiconductor device 100h. For example, when SiGe is used for the source/drain regions 150 in a pFET, the internal spacer layer 130 may be selectively omitted only in the pFET in order to improve the crystallinity of SiGe. That is, some regions may have the internal spacer layer 130, and other regions may not include the internal spacer layer 130.

Figure 9A:
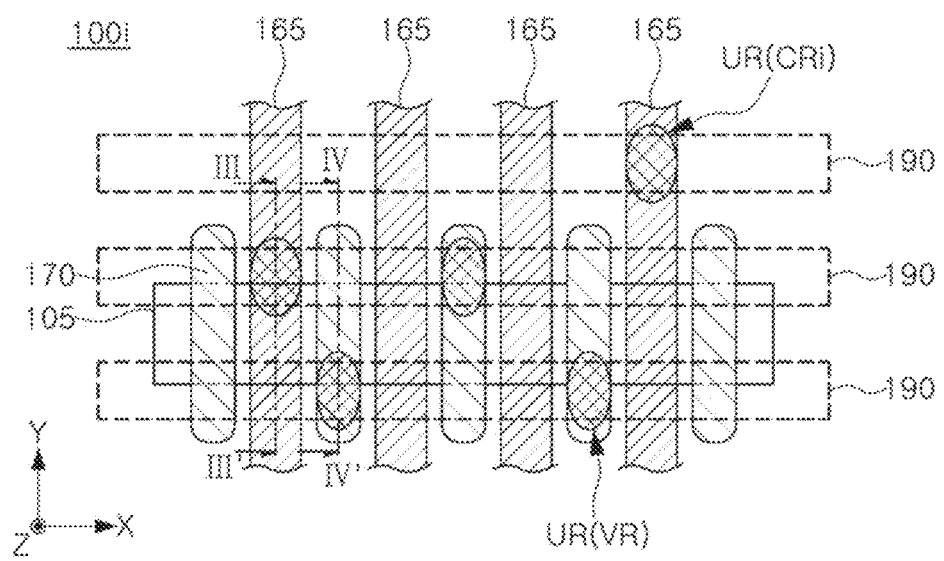
FIGS. 9A and 9B are schematic layout and cross-sectional views of a semiconductor device according to some example embodiments.
Figure 9B:
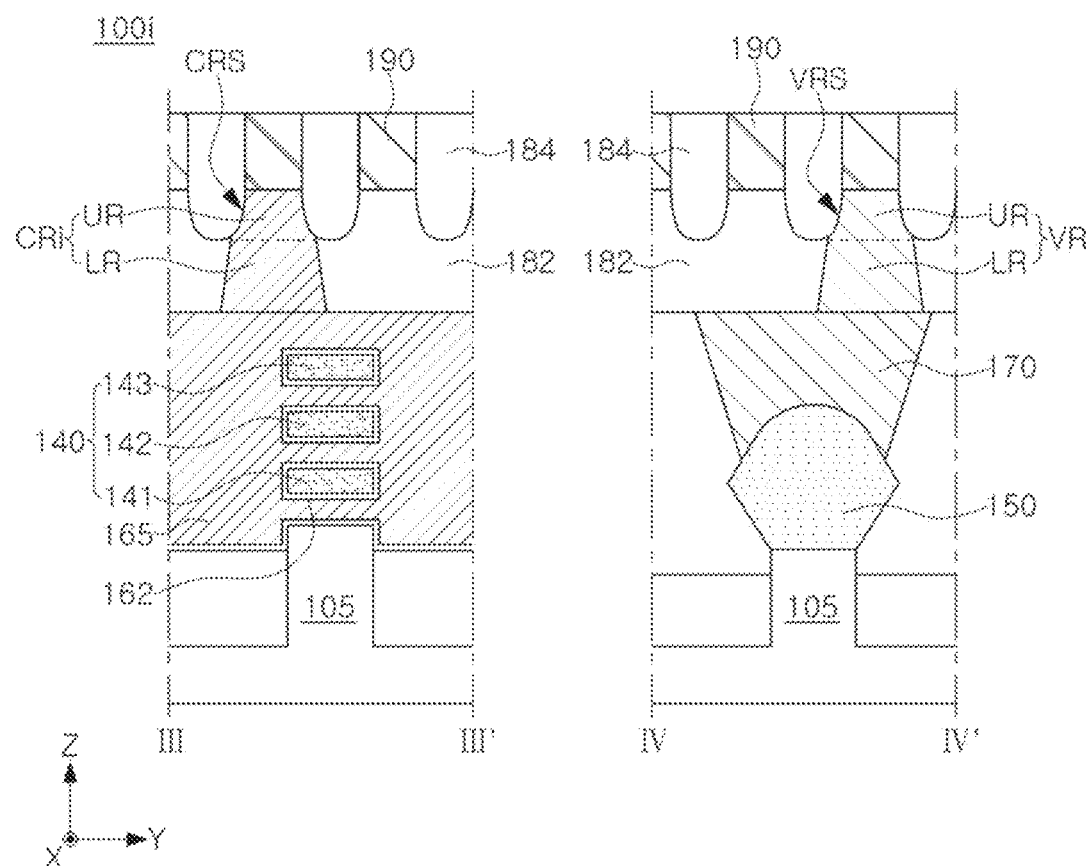

FIGS. 9A and 9B are schematic layout and cross-sectional views of a semiconductor device according to some example embodiments. FIG. 9B illustrates cross-sections of the semiconductor device of FIG. 9A taken along cutting lines III-III' and IV-IV'.

Figure 10:
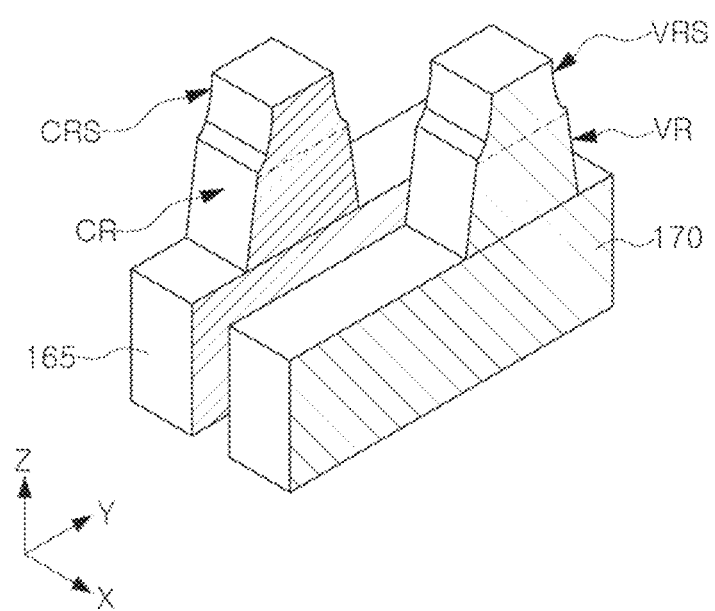
FIG. 10 is a schematic perspective view of a semiconductor device according to some example embodiments.

FIG. 10 is a schematic perspective view of a semiconductor device according to some example embodiments.

Referring to FIGS. 9A to 10, a semiconductor device 100i may include a contact region CRi connecting the gate electrode 165 and the interconnection line 190 and a via region VR connecting the contact plug 170 and the interconnection line 190. According to some example embodiments, the contact region CRi may include the same material as that of the gate electrode 165 and be integrally formed with the gate electrode 165, as in the example embodiments of FIGS. 2A to 3. Alternatively, the contact region CRi may be a separate configuration that is formed separately from the gate electrode 165 and distinguished from each other. The via region VR may include the same material as that of the contact plug 170 and be integrally formed with the contact plug 170, or may be a separate configuration that is distinguished from each other. The semiconductor device 100i is illustrated as including a transistor having an MBCFET™ structure including the channel structure 140, but is not limited thereto. For example, the semiconductor device 100i may include a FinFET in which the gate structure 160 is disposed on the active regions 105 of a fin shape.

The gate electrode 165 may extend on the uppermost third channel layer 143. However, as in the example embodiments of FIGS. 2A to 3, the third channel layer 143 may be exposed in at least one channel structure 140 according to some example embodiments.

The contact region CRi may be disposed on at least one region of the gate electrode 165 in the Y-direction to connect the gate electrode 165 and the interconnection line 190. According to a manufacturing process, inclination of side surfaces of the contact region CRi may be formed so that a width increases toward a lower portion as illustrated, or may be formed conversely. The contact region CRi may include the lower region LR having a relatively great width and the upper region UR having a relatively small width. The contact region CRi may have contact removed regions CRS recessed downwardly between the interconnection lines 190. For example, the contact removed regions CRS may be formed in the contact region CRi in the same shape as an undercut region. A region in which the contact removed regions CRS are formed may be defined as the upper region UR. The side surfaces of the contact region CRi in the Y-direction may have a point between the lower region LR and the upper region UR at which at least one of inclination, curvature, and width is changed or discontinuously and rapidly changed. As illustrated in FIG. 10, the contact removed regions CRS may have a shape extending in the X-direction along the interconnection lines 190.

The via region VR may be disposed on at least one region of the contact plug 170 in the Y-direction to connect the contact plug 170 and the interconnection line 190. The via region VR may include the lower region LR having a relatively great width and the upper region UR having a small width, and may have via removed regions VRS similar to the contact removed regions CRS. The description of the contact region CRi above may be equally applied to the via region VR.

In some example embodiments, since the contact region CRi and the via region VR have the contact removed regions CRS and the via removed regions VRS, respectively, an electrical short between the interconnection lines 190 adjacent in the Y-direction may be prevented or the likelihood thereof reduced.

First and second interlayer insulating layers 182 and 184 may be stacked vertically. The first interlayer insulating layer 182 may cover the upper surface of the gate electrode 165 and the upper surface of the contact plug 170, and the second interlayer insulating layer 184 may be disposed on the first interlayer insulating layer 182 to fill between the interconnection lines 190. The second interlayer insulating layer 184 may have downwardly convex regions to fill the contact removed regions CRS and the via removed regions VRS.

FIGS. 11A through 11K are diagrams illustrating a method of manufacturing a semiconductor device based on a process order according to some example embodiments. FIGS. 11A to 11K illustrate some example embodiments of the method of manufacturing the semiconductor device of FIGS. 1 to 3, and each illustrate cross-sections corresponding to FIGS. 2A and 2B together.

Figure 11A:
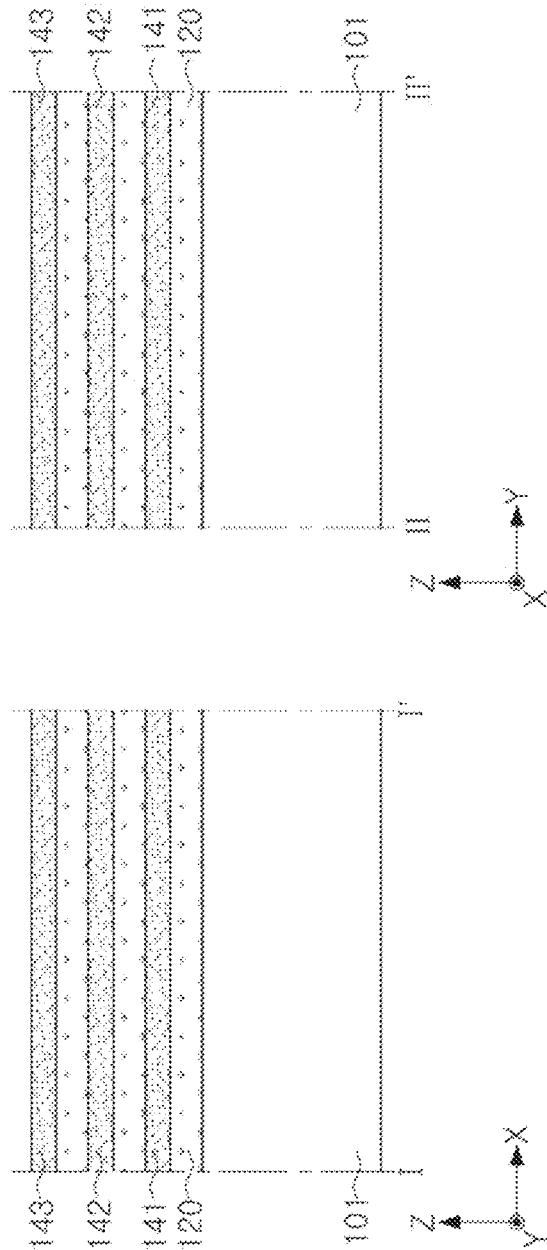
FIGS. 11A through 11K are diagrams illustrating a method of manufacturing a semiconductor device based on a process order according to some example embodiments.

Referring to FIG. 11A, sacrificial layers 120 and the plurality of channel layers 141, 142, and 143 may be alternately stacked on the substrate 101.

The sacrificial layers 120 may be replaced by the gate dielectric layer 162 and the gate electrode 165 as shown in FIGS. 2A and 2B through a subsequent process. The sacrificial layers 120 may be formed of a material having etch selectivity with respect to the plurality of channel layers 141, 142, and 143, respectively. The plurality of channel layers 141, 142, and 143 may include a material different from that of the sacrificial layers 120. The sacrificial layers 120 and the plurality of channel layers 141, 142, and 143 may include, for example, a semiconductor material including at least one of silicon (Si), silicon germanium (SiGe), and germanium (Ge), but may include different materials, and may or may not include impurities. For example, the sacrificial layers 120 may include silicon germanium (SiGe), and the plurality of channel layers 141, 142, and 143 may include silicon (Si).

The sacrificial layers 120 and the plurality of channel layers 141, 142, and 143 may be formed by performing an epitaxial growth process from the substrate 101. Each of the sacrificial layers 120 and the plurality of channel layers 141, 142, and 143 may have a thickness in a range of about or exactly 1 Å to about or exactly 100 nm. The number of layers of the channel layers 141, 142, and 143 alternately stacked with the sacrificial layers 120 may be changed in various ways in some example embodiments.

Figure 11B:
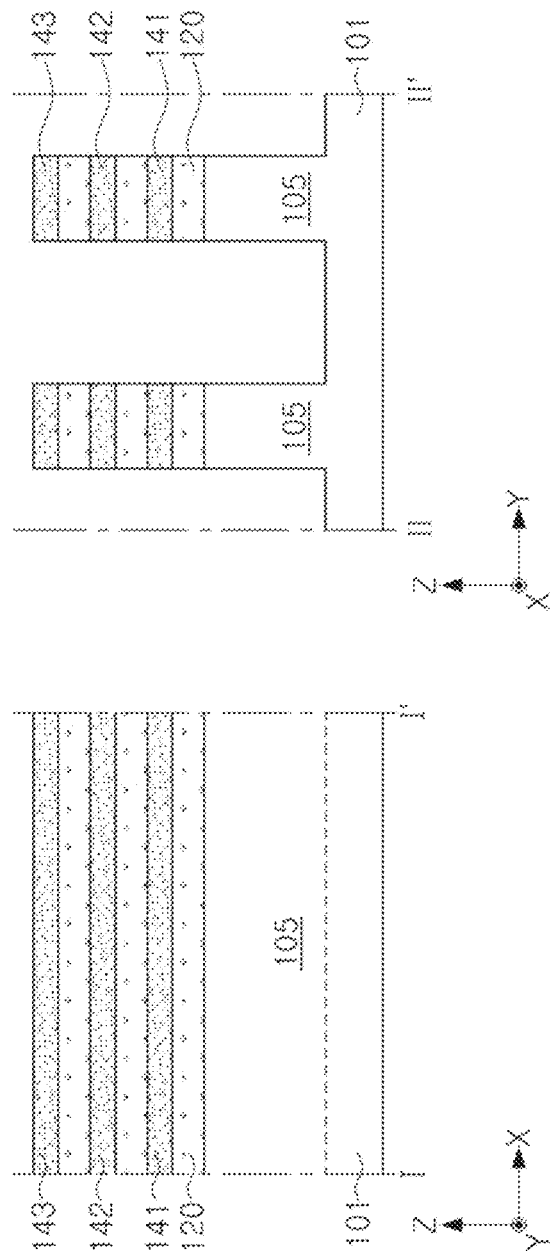

Referring to FIG. 11B, active structures may be formed by removing some of the sacrificial layers 120, the channel layers 141, 142, and 143, and the substrate 101, and the device isolation layer 110 may be formed.

The active structures may include the sacrificial layers 120 and the plurality of channel layers 141, 142, and 143 that are alternately stacked with each other, and may further include the active regions 105 formed to protrude from the substrate 101 by removing a part of the substrate 101. The active structures may be formed in the form of a line extending in one direction, for example, the X-direction, and may be formed to be spaced apart from each other in the Y-direction.

The device isolation layer 110 may be formed in a region where a part of the substrate 101 is removed by filling an insulating material and then removing a part of the insulating material so that the active regions 105 protrude. An upper surface of the device isolation layer 110 may be formed to be lower than upper surfaces of the active regions 105.

Figure 11C:
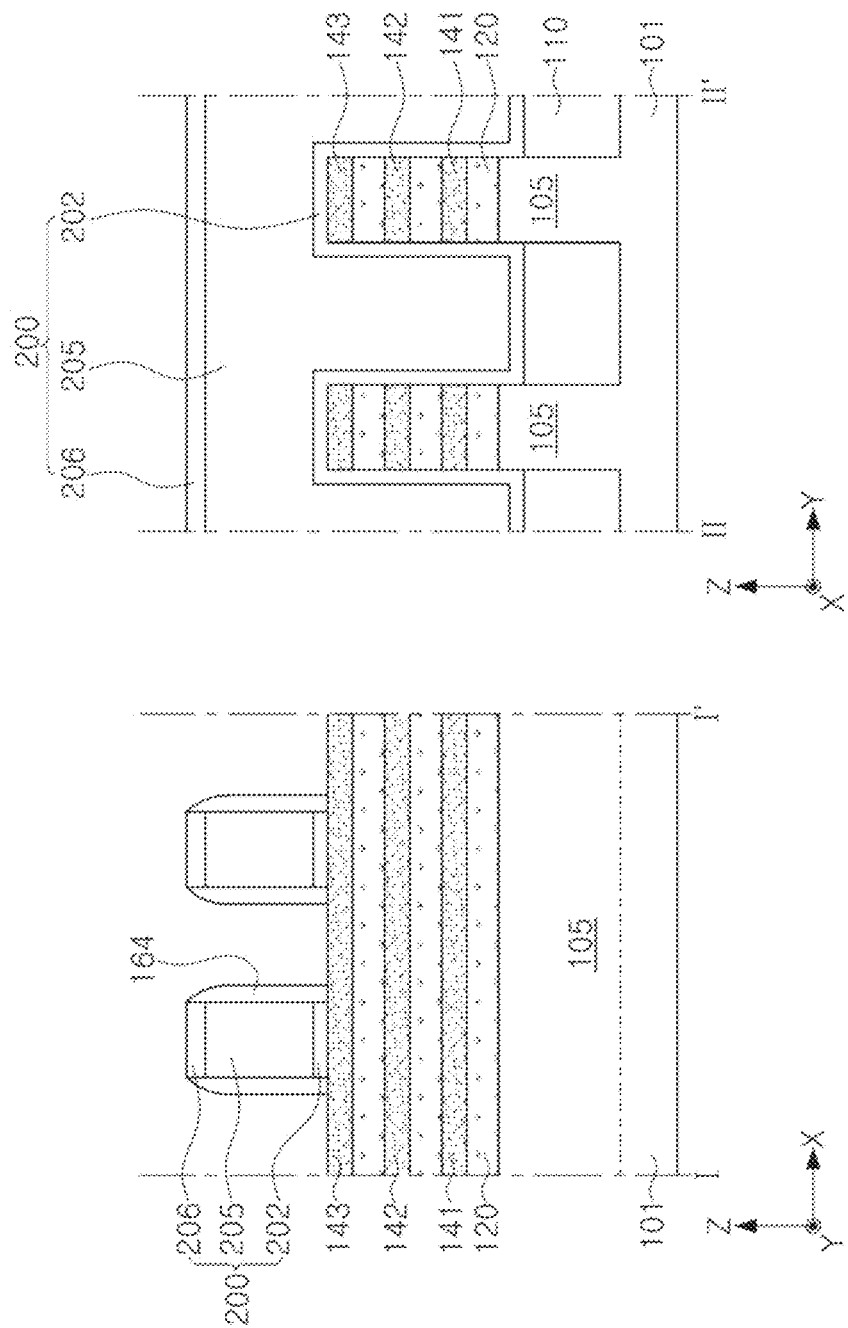

Referring to FIG. 11C, sacrificial gate structures 200 and gate spacer layers 164 may be formed on the active structure.

The sacrificial gate structures 200 may be sacrificial structures formed in a region where the gate dielectric layer 162 and the gate electrode 165 are disposed on the first and second channel structures 140A and 140B, as shown in FIGS. 2A and 2B by a subsequent process. The sacrificial gate structure 200 may include first and second sacrificial gate layers 202 and 205 and a mask pattern layer 206 that are sequentially stacked. The first and second sacrificial gate layers 202 and 205 may be patterned using the mask pattern layer 206. The first and second sacrificial gate layers 202 and 205 may be an insulating layer and a conductive layer, respectively, but are not limited thereto, and the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride. The sacrificial gate structures 200 may have a line shape that intersects the active structures and extends in one direction. The sacrificial gate structures 200 may extend, for example, in the Y-direction and may be disposed to be spaced apart from each other in the X-direction.

The gate spacer layers 164 may be formed on both sidewalls of the sacrificial gate structures 200. The gate spacer layers 164 may be formed of a low-k material, and may include, for example, at least one of SiO, SiN, SiCN, SiOC, SiON, and SiOCN.

Figure 11D:
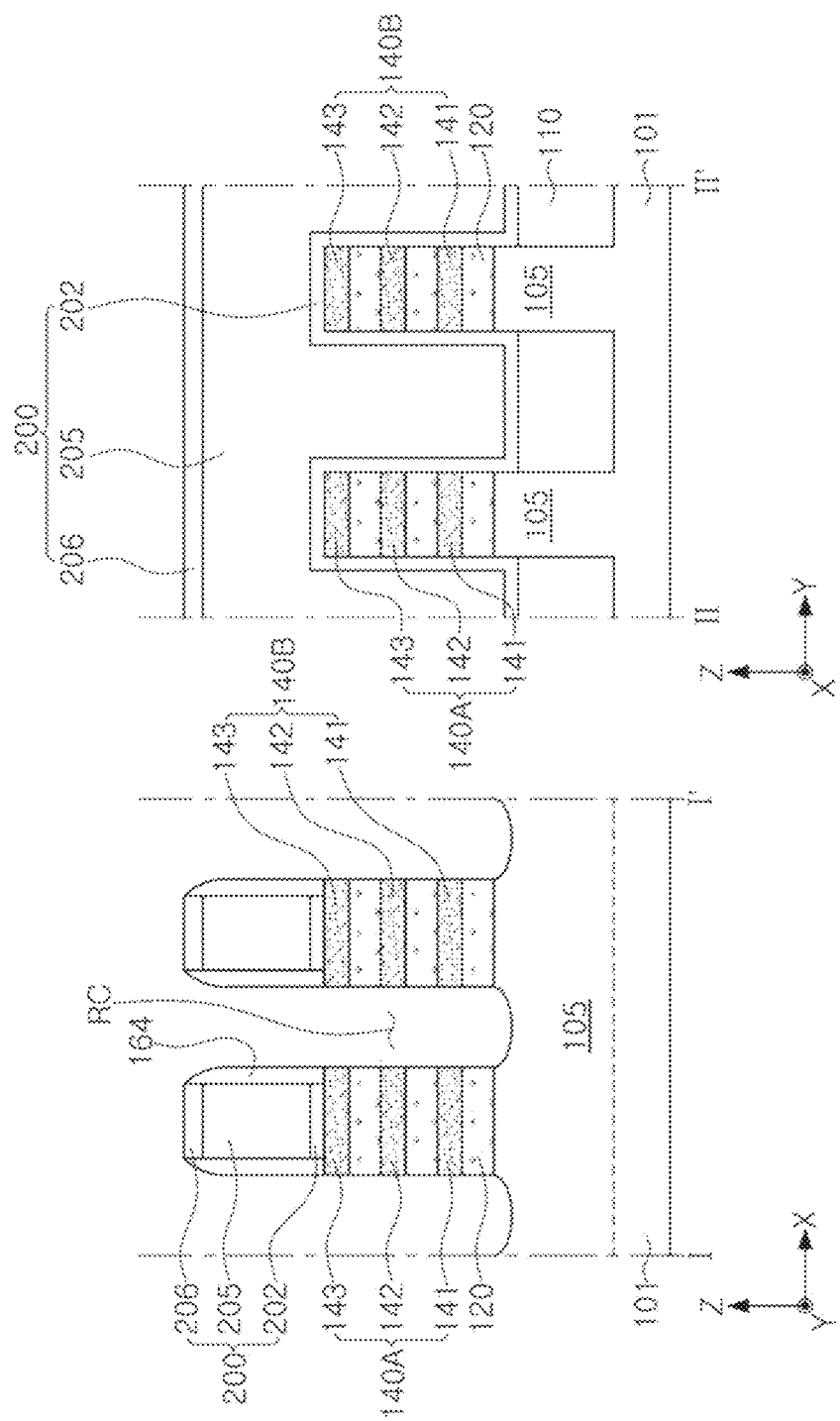

Referring to FIG. 11D, recess regions RC may be formed by partially removing the exposed sacrificial layers 120 and plurality of channel layers 141, 142, and 143 between the sacrificial gate structures 200.

First, the recess regions RC may be formed by partially removing the exposed sacrificial layers 120 and plurality of channel layers 141, 142, and 143, by using the sacrificial gate structures 200 and the gate spacer layers 164 as masks. Accordingly, the plurality of channel layers 141, 142, and 143 may constitute the first and second channel structures 140A and 140B having limited lengths in the X-direction.

Figure 11E:
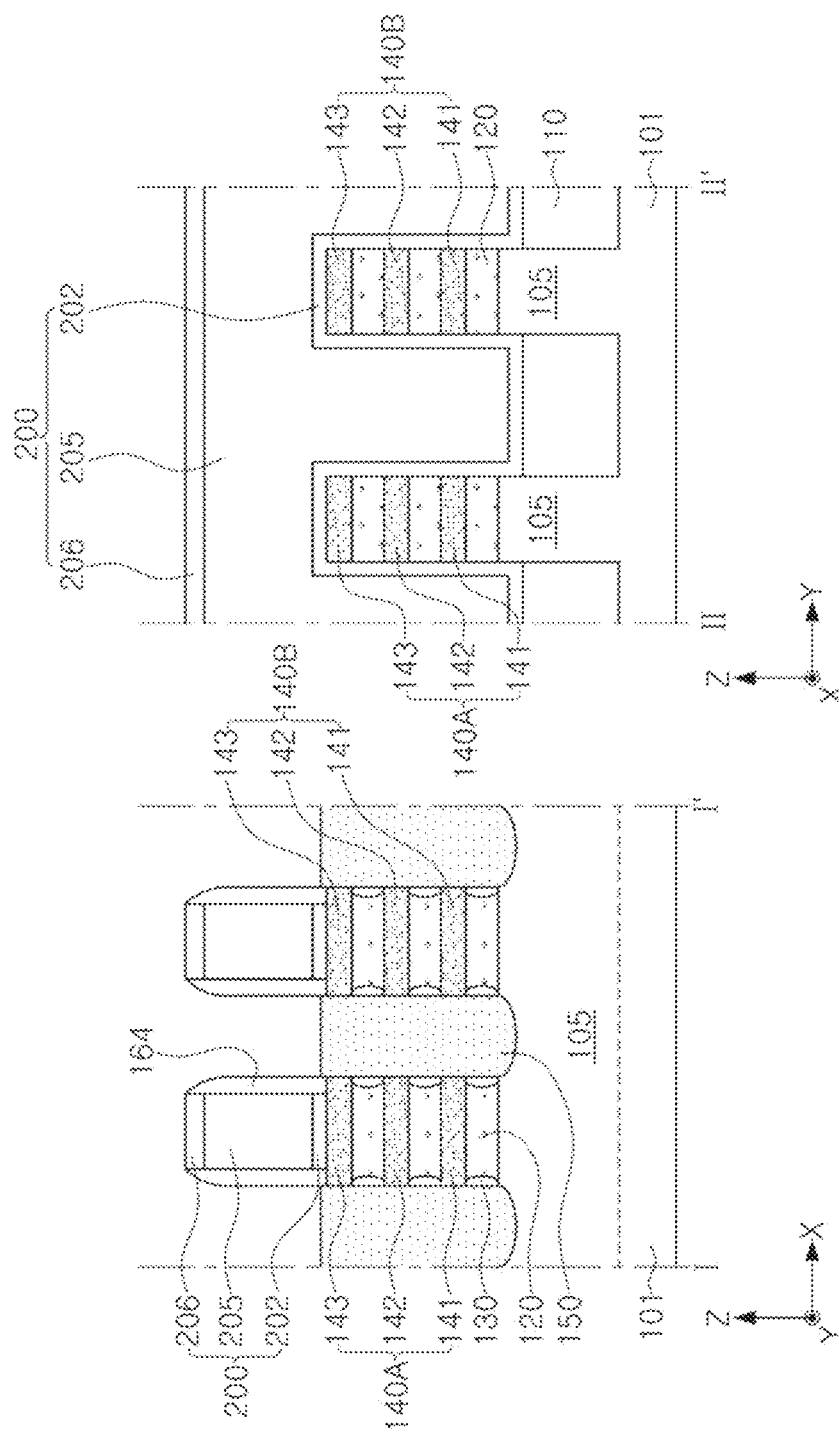

Referring to FIG. 11E, the internal spacer layers 130 may be formed, and the source/drain regions 150 filling the recess regions RC may be formed.

First, the sacrificial layers 120 exposed through the recess regions RC may be partially removed from side surfaces thereof. The sacrificial layers 120 may be selectively etched with respect to the first and second channel structures 140A and 140B by, for example, a wet etching process, and removed at a certain depth from the side surfaces thereof in the x direction. The sacrificial layers 120 may have inwardly concave side surfaces by side etching as described above. However, the shape of the side surfaces of the sacrificial layers 120 are not limited to that illustrated.

Next, the internal spacer layers 130 may be formed in a region where the sacrificial layers 120 are partially removed. The internal spacer layers 130 may be formed by filling an insulating material in the region where the sacrificial layers 120 are removed and removing the insulating material deposited on the outside of the first and second channel structures 140A and 140B. The internal spacer layers 130 may be formed of the same material as that of the gate spacer layers 164, but are not limited thereto. For example, the internal spacer layers 130 may include at least one of SiN, SiCN, SiOCN, SiBCN, and SiBN.

Next, the source/drain regions 150 may be formed by growing from the side surfaces of the active regions 105 and the first and second channel structures 140A and 140B, for example, by a selective epitaxial process. The source/drain regions 150 may include impurities by in-situ doping, and may include a plurality of layers having different doping elements and/or doping concentrations.

Figure 11F:
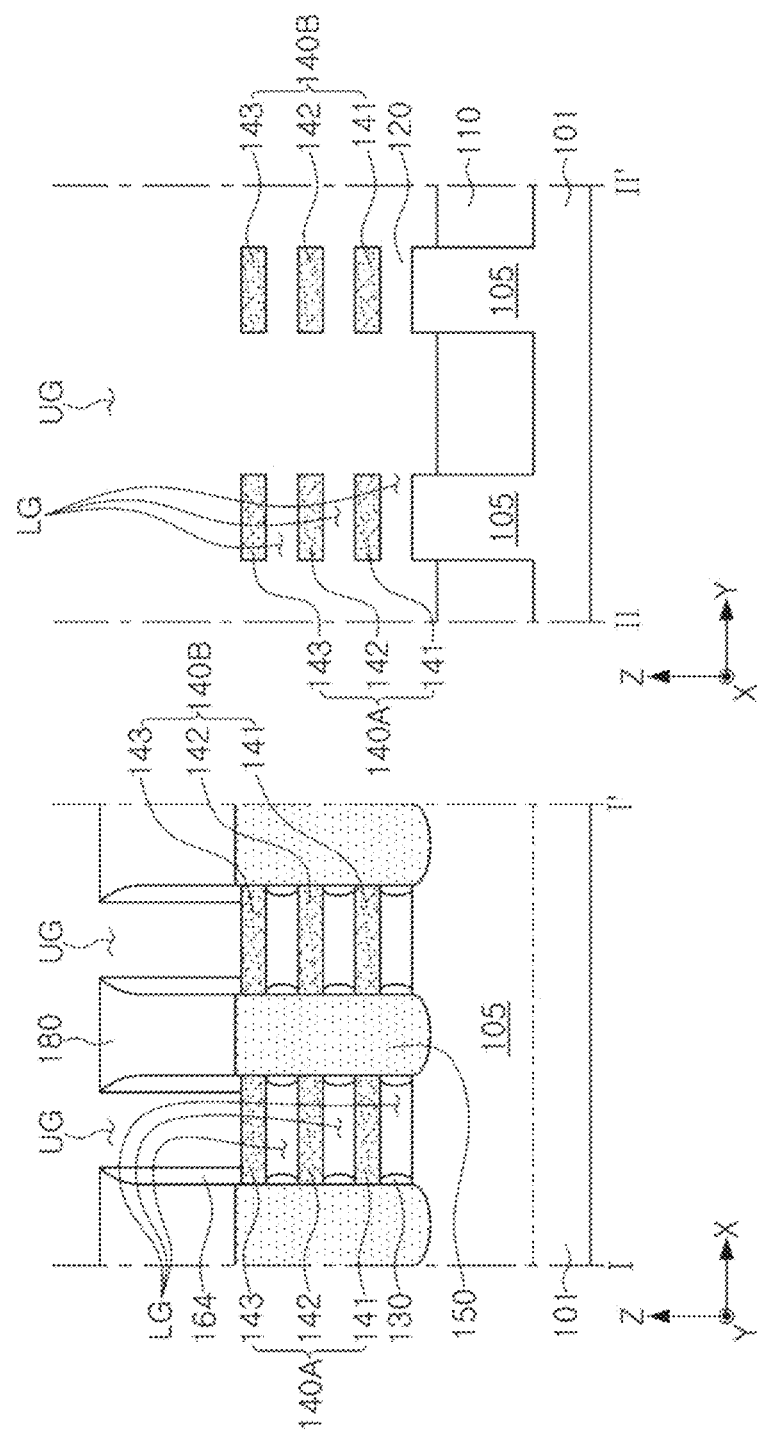

Referring to FIG. 11F, the interlayer insulating layer 180 may be formed, and the sacrificial layers 120 and the sacrificial gate structures 200 may be removed.

The interlayer insulating layer 180 may be formed by forming an insulating film covering the sacrificial gate structures 200 and the source/drain regions 150, and performing a planarization process.

The sacrificial layers 120 and the sacrificial gate structures 200 may be selectively removed with respect to the gate spacer layers 164, the interlayer insulating layer 180, the first and second channel structures 140A and 140B, and the internal spacer layers 130. First, upper gap regions UG may be formed by removing the sacrificial gate structures 200, and then lower gap regions LG may be formed by removing the sacrificial layers 120 exposed through the upper gap regions UG. For example, when the sacrificial layers 120 include silicon germanium (SiGe) and the first and second channel structures 140A and 140B include silicon (Si), the sacrificial layers 120 may be selectively removed by performing a wet etching process that uses peracetic acid as an etchant. During the removal process, the source/drain regions 150 may be protected by the interlayer insulating layer 180 and the internal spacer layers 130.

Figure 11G:
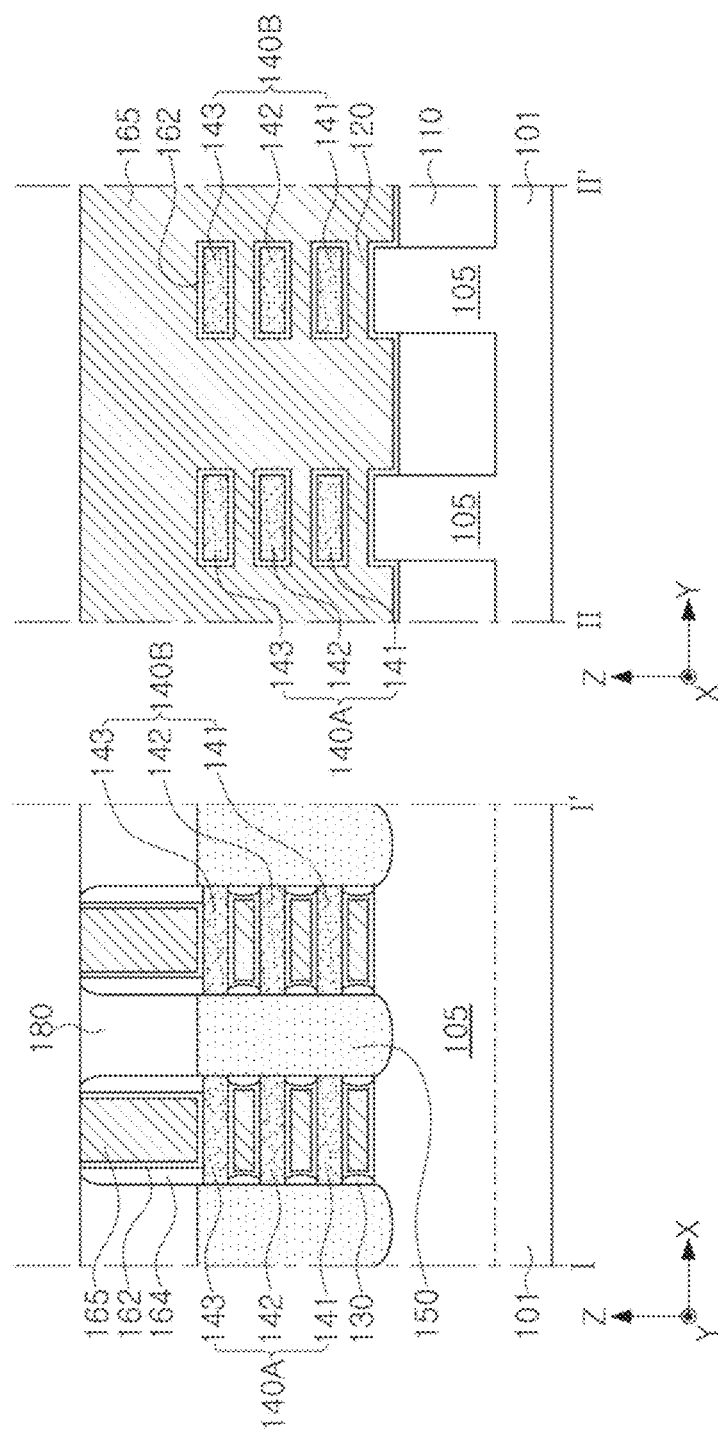

Referring to FIG. 11G, the gate dielectric layers 162 and the gate electrodes 165 may be formed.

The gate dielectric layers 162 and the gate electrodes 165 may be formed to fill the upper gap regions UG and the lower gap regions LG. The gate dielectric layers 162 may be formed to conformally cover inner surfaces of the upper gap regions UG and the lower gap regions LG. The gate electrodes 165 may be formed to completely fill the upper gap regions UG and the lower gap regions LG. The gate electrodes 165 may be planarized by a planarization process such as chemical mechanical polishing (CMP).

Figure 11H:
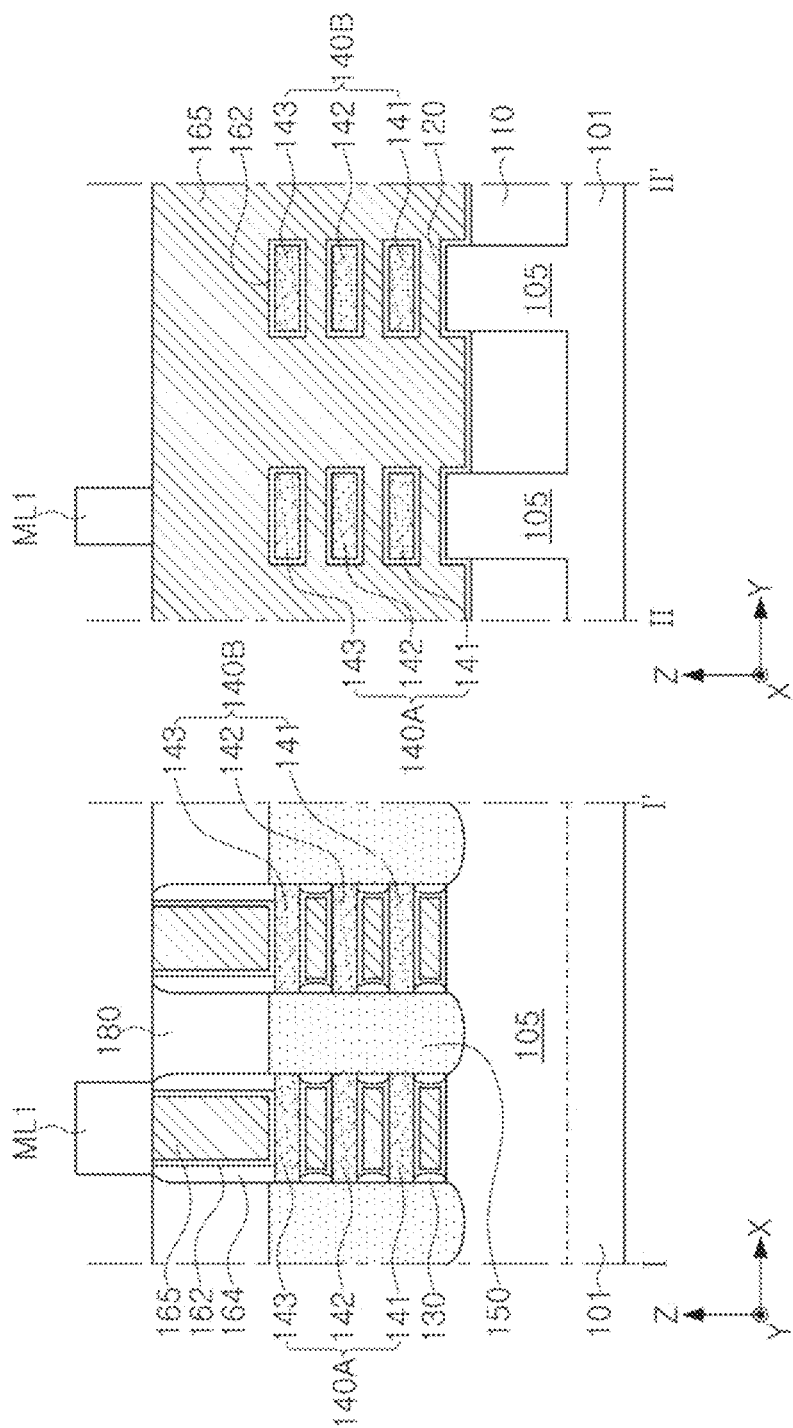

Referring to FIG. 11H, a first mask layer ML1 may be formed on the gate electrodes 165.

The first mask layer ML1 may be formed to partially cover the gate electrodes 165. Specifically, the first mask layer ML1 may be formed to cover a region corresponding to the upper region UR of the contact region CR of FIGS. 2A and 2B.

The first mask layer ML1 may be a hard mask layer including a material having etch selectivity with the gate electrodes 165. The first mask layer ML1 may include, for example, at least one of silicon nitride, silicon oxynitride, and silicon oxide, but is not limited thereto.

Figure 11I:
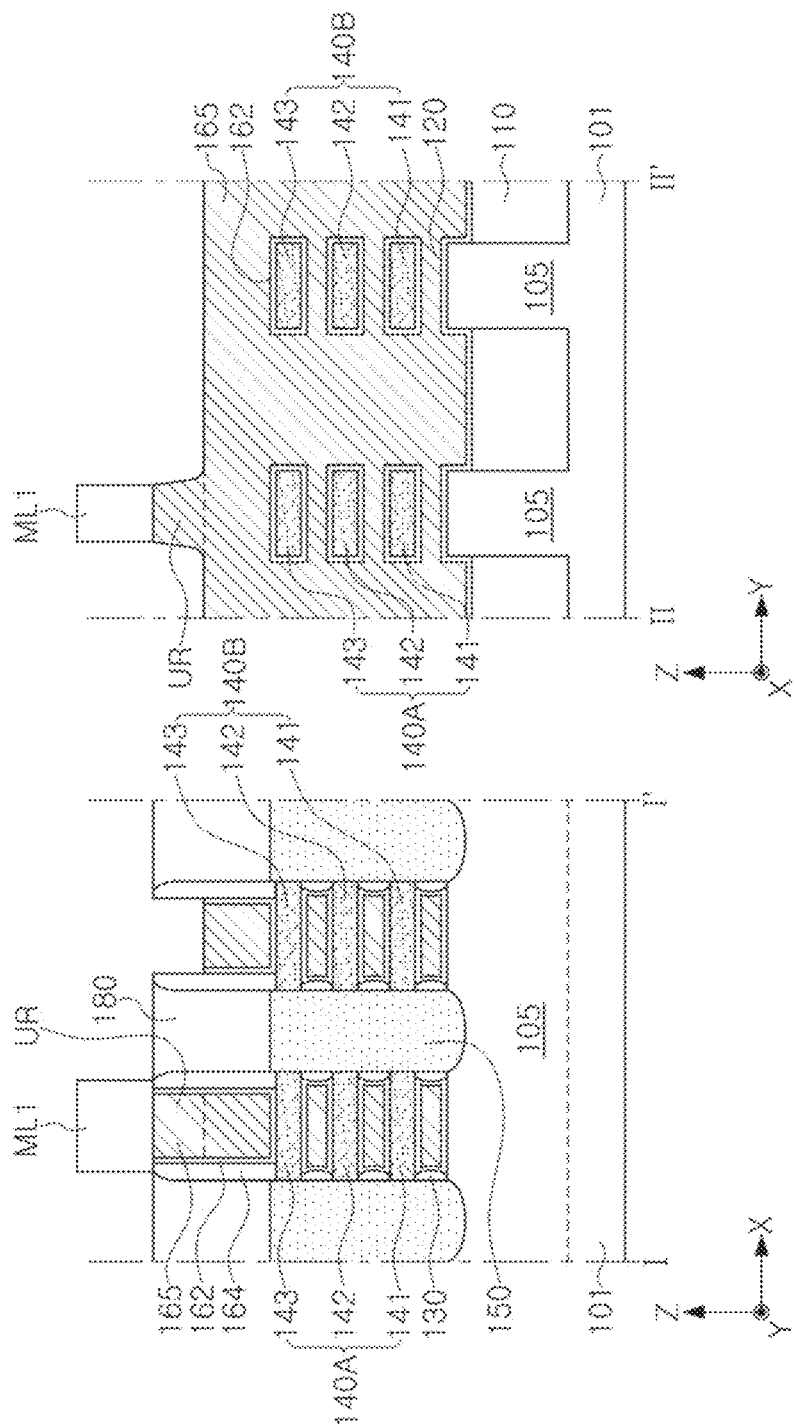

Referring to FIG. 11I, the gate electrodes 165 may be partially removed from upper portions thereof by using the first mask layer ML1.

The gate electrodes 165 may be removed from upper surfaces exposed by the first mask layer ML1 at a certain thickness by a dry etching process. Accordingly, the gate electrode 165 may remain below the first mask layer ML1 so that the upper region UR of the contact region CR (see FIGS. 2A and 2B) may be formed. According to etching process conditions, the side surfaces of the upper region UR may be formed vertically or obliquely, and may have a concave curve (e.g., rounded/curved inwardly or hollowed out).

Figure 11J:
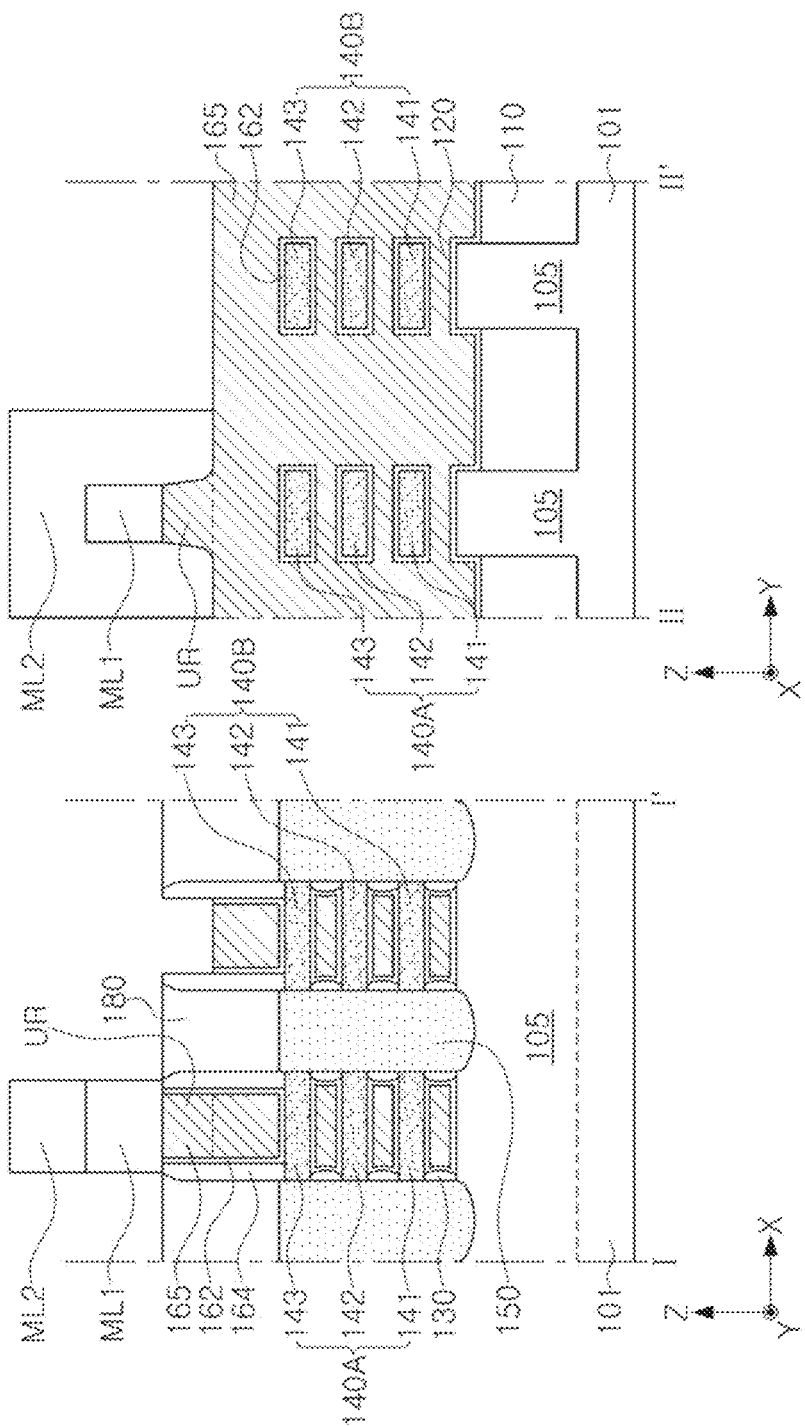

Referring to FIG. 11J, a second mask layer ML2 may be formed on the gate electrodes 165.

The second mask layer ML2 may be formed on the first mask layer ML1 and may be formed to have a broader width than that of the first mask layer ML1 in the Y-direction. Specifically, the second mask layer ML2 may be formed to cover a region corresponding to the lower region LR of the contact region CR of FIGS. 2A and 2B. According to some example embodiments, the second mask layer ML2 may be formed after the first mask layer ML1 is removed.

The second mask layer ML2 may be a hard mask layer including a material having etch selectivity with the gate electrodes 165. The second mask layer ML2 may include, for example, a carbon-based material such as spin on hardmask (SOH), but is not limited thereto.

The semiconductor device 100d of the example embodiments of FIG. 4D may be formed by etching the gate electrode 165 by using only the first mask layer ML1 without forming the second mask layer ML2 in the present step.

Figure 11K:
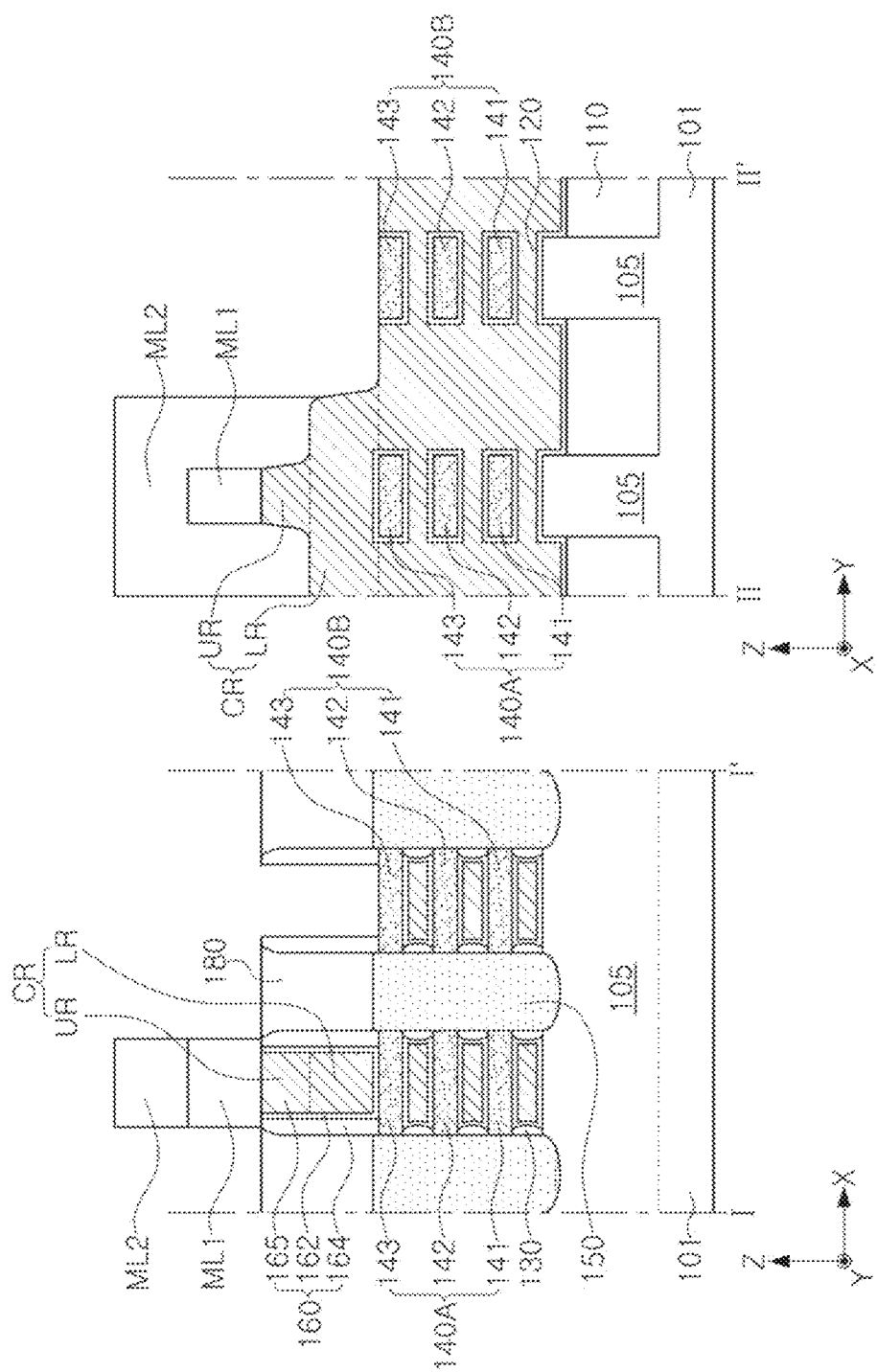

Referring to FIG. 11K, portions of the gate electrodes 165 may be further removed from the upper portion thereof by using the second mask layer ML2.

The gate electrodes 165 may be further removed from the upper surface exposed by the second mask layer ML2 at a certain thickness by the dry etching process. Accordingly, the gate electrode 165 may remain below the second mask layer ML2 so that the lower region LR of the contact region CR may be formed. Accordingly, the contact region CR including the lower region LR and the upper region UR may be formed. According to the etching process conditions, the side surfaces of the lower region LR may be formed vertically or obliquely, and may have a concave curve (e.g., rounded/curved inwardly or hollowed out). During the etching process, the gate dielectric layer 162 on the third channel layer 143 of the second channel structure 140B may also be removed, but is not limited thereto. According to some example embodiments, the gate dielectric layer 162 on the third channel layer 143 may remain.

Through the present operation, the gate structure 160 including the gate electrode 165 having the contact region CR, the gate dielectric layer 162, and the gate spacer layer 164 may be finally manufactured.

The semiconductor device 100e of the example embodiments of FIG. 5 may be manufactured by removing the gate electrodes 165 relatively deeply in the present operation. The semiconductor device 100f of the example embodiments of FIG. 6 may be manufactured by removing the gate electrodes 165 until the etch stop layer 175 is exposed in the present operation, after the etch stop layer 175 is formed on the third channel layers 143.

Next, referring to FIGS. 2A and 2B together, the first and second mask layers ML1 and ML2 may be removed, and the contact plugs 170 and the interconnection lines 190 may be formed.

First, the interlayer insulating layer 180 may be additionally formed and a planarization process may be performed. The contact plugs 170 may be formed by patterning the interlayer insulating layer 180 to form contact holes exposing the source/drain regions 150, and filling the contact holes with a conductive material. The contact plugs 170 may be connected to the interconnection lines 190 by having a via region connected to the interconnection lines 190 in one region or forming a separate via on the contact plugs 170.

The interconnection lines 190 may be formed on the interlayer insulating layer 180, and portions of the interconnection lines 190 may be formed to be connected to the upper region UR of the contact region CR. The interconnection lines 190 may be formed by a single damascene process or a subtractive patterning process.

The semiconductor device 100g of the example embodiments of FIG. 7 may be manufactured by partially removing the interlayer insulating layer 180g exposed between the interconnection lines 190 after the interconnection lines 190 are formed in the present operation. Depending on the shape of the contact region CR, the contact region CR may or may not be also partially removed in a process of partially removing the interlayer insulating layer 180g.

Figure 12:
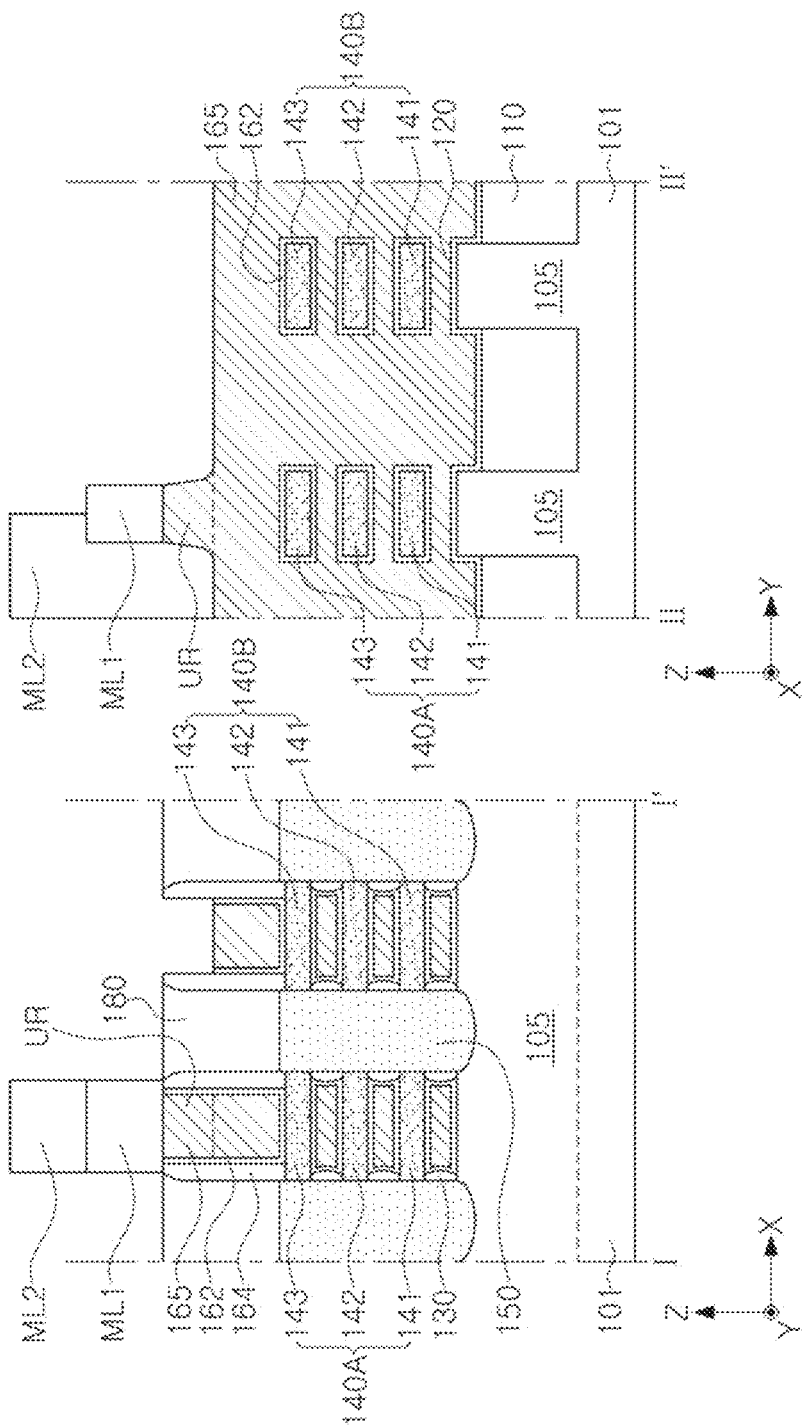
FIG. 12 is a diagram illustrating a method of manufacturing a semiconductor device according to some example embodiments.

FIG. 12 is a diagram illustrating a method of manufacturing a semiconductor device according to some example embodiments. FIG. 12 illustrates some example embodiments of the method of manufacturing the semiconductor device of FIG. 4A.

Referring to FIG. 12, the semiconductor device 100a of the example embodiments of FIG. 4A may be manufactured by making a location of the second mask layer ML2 different, in the manufacturing method described above with reference to FIG. 11J. In some example embodiments, the second mask layer ML2 may be formed to partially overlap the first mask layer ML1 without wholly overlapping the first mask layer ML1.

Similarly, the semiconductor device 100b of the example embodiments of FIG. 4B may be manufactured by forming the second mask layer ML2 to overlap only a part of the right side of the first mask layer ML1 in the Y-direction.

Figure 13A:
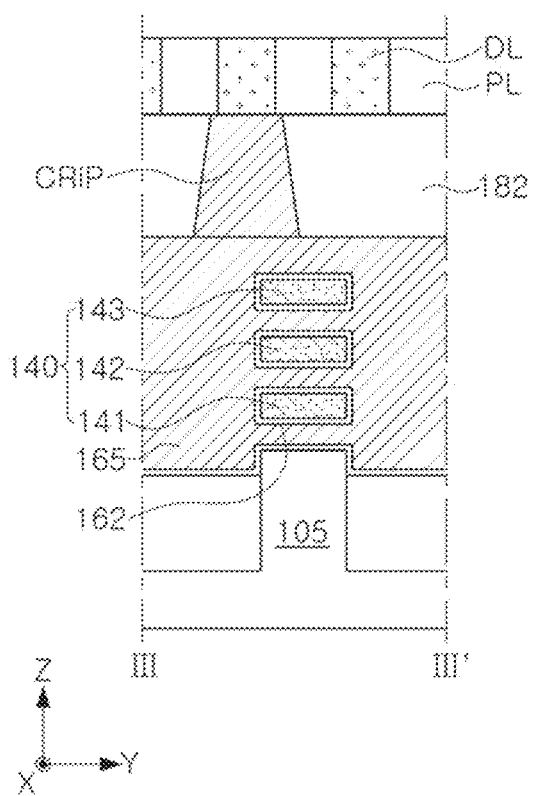
FIGS. 13A through 13C are diagrams illustrating a method of manufacturing a semiconductor device based on a process order according to some example embodiments.
Figure 13B:
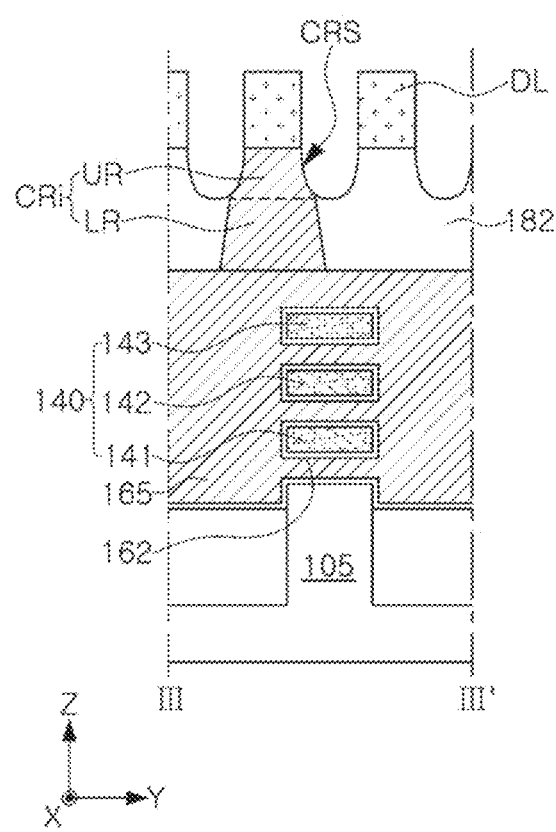
Figure 13C:
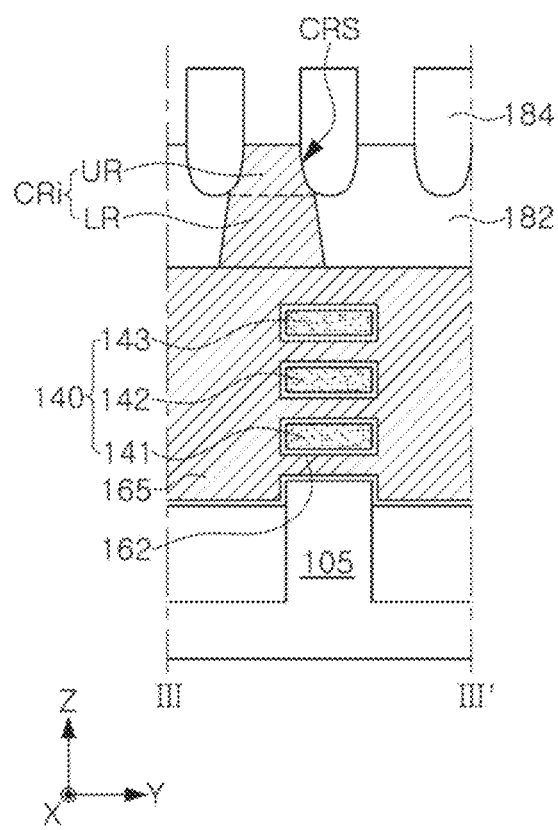

FIGS. 13A through 13C are diagrams illustrating a method of manufacturing a semiconductor device based on a process order according to some example embodiments. FIGS. 13A to 13C illustrate some example embodiments of the method of manufacturing the semiconductor device of FIGS. 9A and 9B, and each illustrate cross-sections corresponding to FIG. 9A.

Referring to FIG. 13A, first, the same process as described above with reference to FIGS. 11A to 11G is performed and then, a preliminary contact region CRiP and dummy interconnection lines DL may be formed on the gate electrode 165.

The preliminary contact region CRiP may be formed by partially removing the gate electrode 165 or may be formed by performing a separate deposition and etching process on the gate electrode 165. The contact plug 170 and the via region VR of FIG. 9B may also be formed in the present operation.

Next, an upper sacrificial layer PL may be formed on the first interlayer insulating layer 182, and the dummy interconnection lines DL may be formed. According to some example embodiments, an etch stop layer may be further formed before the upper sacrificial layer PL is formed. After the upper sacrificial layer PL is formed to have a uniform thickness, the dummy interconnection lines DL may be formed by removing a part of the upper sacrificial layer PL and filling the upper sacrificial layer PL with a dielectric material. For example, the upper sacrificial layer PL may be SOH, and the dummy interconnection lines DL may be a material that may be removed by a strip process, such as SiC, etc.

Referring to FIG. 13B, the upper sacrificial layer PL may be removed, and contact removed regions CRS may be formed.

The upper sacrificial layer PL may be selectively removed by, for example, the strip process. Next, a contact region CRi having the contact removed regions CRS may be formed by partially recessing the first interlayer insulating layer 182 and the preliminary contact region CRiP exposed between the dummy interconnection lines DL. Accordingly, the contact region CRi may have the upper region UR partially removed by the contact removed region CRS and the lower region LR below the upper region UR. The via removed regions VRS of FIG. 9B may also be formed together with the contact removed regions CRS in the present operation.

Referring to FIG. 13C, the second interlayer insulating layer 184 may be formed and the dummy interconnection lines DL may be removed.

The second interlayer insulating layer 184 may be formed by forming a low-k material and then performing a planarization process. The dummy interconnection lines DL may be selectively removed with respect to the second interlayer insulating layer 184 by, for example, the strip process.

Next, referring to FIG. 9B together, the interconnection lines 190 may be formed by depositing a conductive material on a region where the dummy interconnection lines DL are removed.

In FIGS. 13A to 13C, some example embodiments in which the semiconductor device 100i of FIGS. 9A and 9 is manufactured using a single damascene process is described. However, the semiconductor device 100i may be manufactured using a subtractive patterning process. In this case, after the interconnection lines 190 are formed on the preliminary contact region CRiP without forming the dummy interconnection lines DL, the contact removed regions CRS may be formed by partially recessing the first interlayer insulating layer 182 and the preliminary contact region CRiP exposed between the interconnection lines 190.

The present inventive concepts are not limited by the above-described example embodiments and the accompanying drawings, but is intended to be limited by the appended claims. Accordingly, various types of substitutions, modifications and alterations and combinations of example embodiments will be possible by those of ordinary skill in the art within the scope not departing from the technical spirit of the present inventive concepts described in the claims, and this also belongs to the scope of the present inventive concepts.

According to some example embodiments, by including the gate electrode having the contact region and exposing a portion of the channel layer, the semiconductor device having improved reliability and electrical characteristics may be provided.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Various advantages and effects of the present inventive concepts are not limited to the description above, and may be more readily understood in the description of example embodiments of the present inventive concepts.

What is claimed is:

1. A semiconductor device comprising:
active regions extending in a first direction on a substrate;
a gate electrode intersecting the active regions on the substrate and extending in a second direction;
first and second channel structures spaced apart from each other in the second direction on the active regions, each of the first and second channel structures including a plurality of channel layers spaced apart from each other in a third direction perpendicular to an upper surface of the substrate and surrounded by the gate electrode;
an interconnection line on the gate electrode and connected to the gate electrode; and
source/drain regions in regions in which the active regions are recessed on both sides of the gate electrode and in contact with the plurality of channel layers,
the gate electrode including a contact region located on at least a portion of a first uppermost channel layer that is an uppermost channel layer among the plurality of channel layers of the first channel structure and connected to the interconnection line, and
the gate electrode exposing at least a portion of a second uppermost channel layer that is an uppermost channel layer among the plurality of channel layers of the second channel structure.

2. The semiconductor device of claim 1, wherein the contact region includes a lower region having a first width in the second direction and an upper region located on the lower region and having a second width smaller than the first width in the second direction.

3. The semiconductor device of claim 2, wherein side surfaces of the upper region in the second direction have a curve of a concave shape.

4. The semiconductor device of claim 2, wherein the interconnection line has a third width smaller than the first width in the second direction.

5. The semiconductor device of claim 1, wherein the contact region has an asymmetric shape in the second direction.

6. The semiconductor device of claim 1, wherein a height of the contact region is in a range of about 10 nm to about 30 nm.

7. The semiconductor device of claim 1, wherein an upper surface of the gate electrode is located at a same or lower level as a level of an upper surface of the second uppermost channel layer, on the second channel structure.

8. The semiconductor device of claim 7, wherein the upper surface of the gate electrode is located at a same or higher level as a level of a lower surface of the second uppermost channel layer, on the second channel structure.

9. The semiconductor device of claim 1, further comprising:
   etch stop layers on the first and second uppermost channel layers.

10. The semiconductor device of claim 9, wherein the gate electrode covers the etch stop layer on the first uppermost channel layer and exposes the etch stop layer on the second uppermost channel layer.

11. The semiconductor device of claim 1, further comprising:
   an interlayer insulating layer covering the gate electrode and below the interconnection line,
   wherein the interconnection line includes a plurality of interconnection lines spaced apart from each other in the second direction, and
   wherein the interlayer insulating layer includes a region in contact with a part of side surfaces of the contact region and concavely recessed from an upper surface, between facing ends of the interconnection lines adjacent in the second direction.

12. The semiconductor device of claim 1, wherein at least one of side surfaces of the contact region in the second direction is located so as not to overlap the first channel structure in the third direction.

13. The semiconductor device of claim 1, further comprising:
   internal spacer layers between the gate electrode and the source/drain regions in the first direction.

14. A semiconductor device comprising:
   active regions extending in a first direction on a substrate;
   a gate electrode intersecting the active regions on the substrate, extending in a second direction, and including a contact region protruding upwardly; and
   an interconnection line on the gate electrode and connected to the contact region,
   the contact region including a lower region having a first width in the second direction and an upper region located on the lower region and having a second width smaller than the first width in the second direction, and
   at least one side surface of the contact region in the second direction having a point at which an inclination or a curvature is changed between the lower region and the upper region.

15. The semiconductor device of claim 14, wherein a width of an upper surface of the upper region in the second direction is smaller than a width of a lower surface of the upper region in the second direction.

16. The semiconductor device of claim 14, wherein the contact region has an asymmetric shape in the second direction.

17. The semiconductor device of claim 14, wherein the contact region is located on one side end portion of the gate electrode in the second direction.

18. The semiconductor device of claim 14, further comprising:
   first and second channel structures spaced apart from each other in the second direction on the active regions,
   wherein each of the first and second channel structures includes a plurality of channel layers spaced apart from each other in a third direction perpendicular to an upper surface of the substrate and surrounded by the gate electrode, and
   wherein the gate electrode exposes at least a portion of an uppermost channel layer among the plurality of channel layers of the second channel structure, on the second channel structure.

19. A semiconductor device comprising:
   active regions extending in a first direction on a substrate;
   a gate electrode intersecting the active regions on the substrate and extending in a second direction;
   first and second channel structures spaced apart from each other in the second direction on the active regions, each of the first and second channel structures including a plurality of channel layers spaced apart from each other in a third direction perpendicular to an upper surface of the substrate and surrounded by the gate electrode; and
   an interconnection line on the gate electrode and connected to the gate electrode,
   an upper surface of the gate electrode being located at a first level to be physically connected to the interconnection line at a contact location, the contact location overlapping at least a portion of the first channel structure in the third direction, and being located at a second level adjacent to an uppermost channel layer among the plurality of channel layers of the second channel structure on at least a portion of the second channel structure and lower than the first level.

20. The semiconductor device of claim 19, wherein the gate electrode includes a contact region protruding upwardly on the first channel structure and connected to the interconnection line.

* * * * *